(12) United States Patent
Jin et al.

(10) Patent No.: US 11,456,327 B2
(45) Date of Patent: Sep. 27, 2022

(54) IMAGE SENSOR AND IMAGING DEVICE

(71) Applicant: Samsung Electronics Co., Ltd., Suwon-si (KR)

(72) Inventors: Young Gu Jin, Suwon-si (KR); Young Chan Kim, Seongnam-si (KR); Yong Hun Kwon, Hwaseong-si (KR); Eung Kyu Lee, Seoul (KR); Chang Keun Lee, Seoul (KR); Moo Sup Lim, Yongin-si (KR); Tae Sub Jung, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 128 days.

(21) Appl. No.: 16/524,806

(22) Filed: Jul. 29, 2019

(65) Prior Publication Data
US 2020/0286942 A1 Sep. 10, 2020

(30) Foreign Application Priority Data
Mar. 6, 2019 (KR) ........................ 10-2019-0025716

(51) Int. Cl.
*H01L 27/146* (2006.01)
*H01L 31/167* (2006.01)

(52) U.S. Cl.
CPC .... *H01L 27/14636* (2013.01); *H01L 27/1463* (2013.01); *H01L 27/14603* (2013.01);
(Continued)

(58) Field of Classification Search
CPC ......... H01L 27/14627; H01L 27/14621; H01L 27/14636; H01L 27/1464; H01L 27/14645; H01L 27/1463; H01L 27/14685; H01L 27/14629; H01L 27/14623; H01L 27/14689; H01L 27/14625; H01L 27/14643; H01L 27/14634; H01L 27/14641; H01L 27/307; H01L 27/14605; H01L 27/14687; H01L 27/1461; H01L 27/14614; H01L 27/14647; H01L 27/14607; H01L 27/14632; H01L 27/14665; H01L 23/481; H01L 27/286; H01L 31/02327; H01L 21/76898; H01L 27/14638; H01L 31/02161; H01L 27/146; H01L 27/14618; H01L 27/14683;
(Continued)

(56) References Cited

U.S. PATENT DOCUMENTS 7,763,918 B1 * 7/2010 Feng ................. H01L 27/14605
257/292
8,054,371 B2 11/2011 Wang et al.
(Continued)

*Primary Examiner* — Maliheh Malek
(74) *Attorney, Agent, or Firm* — Harness, Dickey & Pierce, P.L.C.

(57) ABSTRACT

An image sensor includes a semiconductor substrate including a plurality of pixel regions, a first surface, and a second surface opposing the first surface, a plurality of transistors adjacent to the first surface of the semiconductor substrate in each of the plurality of pixel regions, a microlens on the second surface of the semiconductor substrate, and a plurality of conductive patterns in contact with the semiconductor substrate and closer to the second surface of the semiconductor substrate than to the first surface of the semiconductor substrate in each of the plurality of pixel regions.

14 Claims, 28 Drawing Sheets

(52) U.S. Cl.
CPC .. *H01L 27/14612* (2013.01); *H01L 27/14627* (2013.01); *H01L 27/14643* (2013.01); *H01L 31/167* (2013.01); *H01L 27/14605* (2013.01)

(58) Field of Classification Search
CPC ........... H01L 27/1469; H01L 27/14843; H01L 2924/00; H01L 31/02162; H01L 51/442; H01L 21/0214; H01L 21/3144; H01L 21/3145; H01L 2224/06517; H01L 2224/09517; H01L 2224/80357; H01L 25/167; H01L 27/14649; H01L 27/14667; H01L 27/14692; H01L 27/281; H01L 2924/00012; H01L 2924/00014; H01L 2924/12043; H01L 2924/181; H01L 31/103; H01L 51/447; H01L 21/31053; H01L 21/31055; H01L 21/3212; H01L 21/76831; H01L 2224/04042; H01L 2224/08145; H01L 2224/11; H01L 2224/13; H01L 2224/16225; H01L 2224/45015; H01L 2224/45099; H01L 2224/48; H01L 2224/48091; H01L 224/48463; H01L 2224/80359; H01L 2224/80895; H01L 2224/80896; H01L 2224/80986; H01L 2224/9202; H01L 2224/97; H01L 2251/301; H01L 23/49822; H01L 23/49838; H01L 23/5226; H01L 23/5283; H01L 23/60; H01L 24/03; H01L 24/05; H01L 24/08; H01L 24/48; H01L 25/50; H01L 27/142; H01L 27/14654; H01L 27/14818; H01L 27/28; H01L 2924/0002; H01L 2924/14; H01L 2924/207; H01L 2924/3025; H01L 31/022408; H01L 31/0232; H01L 31/02325; H01L 31/035236; H01L 31/035254; H01L 31/035281; H01L 31/105; H01L 31/109; H01L 31/173; H01L 31/18; H01L 31/1804; H01L 31/1868; H01L 51/42; H01L 51/4213; H01L 51/4253; H01L 51/445; H01L 27/14603

See application file for complete search history.

(56) References Cited

U.S. PATENT DOCUMENTS

| | | | | |
|---|---|---|---|---|
| 8,384,133 | B2* | 2/2013 | Moon | G03F 7/091 257/233 |
| 8,384,172 | B2* | 2/2013 | Lee | H01L 27/14627 257/432 |
| 8,537,255 | B2* | 9/2013 | Lee | H04N 9/04557 257/435 |
| 8,558,335 | B2* | 10/2013 | Nagano | H01L 27/14818 257/458 |
| 8,582,019 | B2* | 11/2013 | Fujii | H04N 5/232122 348/350 |
| 8,743,265 | B2* | 6/2014 | Toumiya | H01L 27/14685 348/340 |
| 8,759,742 | B2 | 6/2014 | Yokogawa | |
| 9,263,490 | B2* | 2/2016 | Yanagita | H01L 23/481 |
| 9,274,254 | B2* | 3/2016 | Igarashi | H01L 27/14643 |
| 9,426,399 | B2* | 8/2016 | Yamaguchi | H01L 27/14605 |
| 9,570,493 | B2* | 2/2017 | Cheng | H01L 27/1464 |
| 9,674,493 | B2 | 6/2017 | Li et al. | |
| 9,773,831 | B1* | 9/2017 | Yang | H01L 27/14634 |
| 9,917,121 | B2 | 3/2018 | Hsu et al. | |
| 9,960,198 | B2 | 5/2018 | Yokogawa | |
| 10,079,259 | B2* | 9/2018 | Yu | H01L 27/14621 |
| 10,504,952 | B2* | 12/2019 | Cheng | H01L 27/14645 |
| 10,672,817 | B2* | 6/2020 | Lee | H01L 27/14689 |
| 10,868,059 | B2* | 12/2020 | Jin | H01L 27/14603 |
| 11,183,525 | B2* | 11/2021 | Lim | H01L 27/14621 |
| 11,222,913 | B2* | 1/2022 | Hsu | H01L 27/1463 |
| 2005/0280108 | A1* | 12/2005 | Kim | H01L 27/14627 257/432 |
| 2005/0287479 | A1* | 12/2005 | Moon | H01L 21/3145 257/E21.268 |
| 2006/0113622 | A1* | 6/2006 | Adkisson | H01L 27/14685 257/E21.582 |
| 2006/0138488 | A1* | 6/2006 | Kim | H01L 27/14689 257/292 |
| 2006/0175551 | A1* | 8/2006 | Fan | G01J 5/022 250/353 |
| 2007/0057338 | A1* | 3/2007 | Lee | H01L 27/14623 257/432 |
| 2007/0102621 | A1* | 5/2007 | Kim | H01L 27/14685 250/208.1 |
| 2007/0181923 | A1* | 8/2007 | Tanaka | H01L 27/14627 257/294 |
| 2008/0011936 | A1* | 1/2008 | Kuo | H01L 27/14627 250/208.1 |
| 2008/0170143 | A1 | 7/2008 | Yoshida | |
| 2008/0237766 | A1* | 10/2008 | Kim | H01L 27/14627 257/432 |
| 2009/0127441 | A1* | 5/2009 | Hwang | H01L 27/14685 257/E31.127 |
| 2009/0295953 | A1* | 12/2009 | Nozaki | H01L 27/14627 348/294 |
| 2010/0140733 | A1* | 6/2010 | Lee | H01L 27/14636 257/447 |
| 2010/0144084 | A1* | 6/2010 | Doan | H01L 31/02327 438/72 |
| 2010/0176280 | A1* | 7/2010 | Yokogawa | G02B 5/204 250/226 |
| 2010/0244168 | A1* | 9/2010 | Shiozawa | H01L 27/14621 257/432 |
| 2011/0019041 | A1* | 1/2011 | Ishiwata | H01L 27/14621 348/280 |
| 2011/0102547 | A1* | 5/2011 | Sul | H01L 27/14621 348/46 |
| 2011/0128423 | A1* | 6/2011 | Lee | H01L 27/14645 348/294 |
| 2011/0176023 | A1* | 7/2011 | Jung | H01L 27/1464 348/222.1 |
| 2011/0281391 | A1* | 11/2011 | Itahashi | H01L 31/0232 438/69 |
| 2011/0287368 | A1* | 11/2011 | Watanabe | H01L 27/14627 430/313 |
| 2011/0316002 | A1* | 12/2011 | Ahn | H01L 27/14685 257/77 |
| 2012/0009720 | A1* | 1/2012 | Shim | H01L 27/14625 257/E31.127 |
| 2012/0025059 | A1* | 2/2012 | Kawashima | H01L 27/14636 250/208.1 |
| 2012/0038814 | A1* | 2/2012 | Tayanaka | H01L 27/14685 348/340 |
| 2012/0091515 | A1* | 4/2012 | Yoo | H01L 27/14618 257/292 |
| 2012/0235266 | A1* | 9/2012 | Ootsuka | H01L 27/14625 257/E31.127 |
| 2012/0248560 | A1* | 10/2012 | Lee | H01L 27/1464 257/E31.127 |
| 2013/0120843 | A1* | 5/2013 | Junger | G02B 5/008 359/589 |
| 2013/0270667 | A1* | 10/2013 | Wang | H01L 27/14621 257/443 |
| 2014/0054662 | A1* | 2/2014 | Yanagita | H01L 27/1463 257/291 |
| 2014/0145287 | A1* | 5/2014 | Kato | H01L 27/14625 257/432 |
| 2014/0146207 | A1* | 5/2014 | Yokogawa | G02B 5/201 348/281 |
| 2014/0217538 | A1* | 8/2014 | Shimotsusa | H01L 27/14623 257/432 |

(56) References Cited

U.S. PATENT DOCUMENTS

| | | | |
|---|---|---|---|
| 2014/0264690 A1* | 9/2014 | Nagata | H01L 27/14627 257/432 |
| 2014/0339606 A1* | 11/2014 | Lin | H01L 27/14621 438/70 |
| 2014/0374868 A1* | 12/2014 | Lee | H01L 27/1463 257/446 |
| 2015/0028405 A1* | 1/2015 | Minami | H01L 27/14685 257/294 |
| 2015/0048469 A1* | 2/2015 | Jung | H01L 27/14621 257/432 |
| 2015/0115388 A1* | 4/2015 | Eda | H01L 27/1464 257/446 |
| 2015/0155320 A1* | 6/2015 | Chien | H01L 27/14629 257/432 |
| 2015/0162365 A1* | 6/2015 | Chang | H01L 27/14636 438/70 |
| 2015/0171125 A1* | 6/2015 | Jangjian | H01L 27/14645 438/70 |
| 2015/0194469 A1* | 7/2015 | Joei | H01L 27/14647 257/40 |
| 2015/0236066 A1* | 8/2015 | Tayanaka | H01L 27/14685 257/432 |
| 2015/0249109 A1* | 9/2015 | Wang | H01L 27/14621 438/70 |
| 2015/0255495 A1* | 9/2015 | Park | H01L 27/14654 257/432 |
| 2016/0005781 A1* | 1/2016 | Lin | H01L 27/14623 257/292 |
| 2016/0013226 A1* | 1/2016 | Shim | H01L 27/14603 348/273 |
| 2016/0043119 A1* | 2/2016 | Lee | H01L 27/1464 250/208.1 |
| 2016/0043125 A1* | 2/2016 | Hatano | H01L 27/14634 257/40 |
| 2016/0049528 A1* | 2/2016 | Cho | H01L 31/035281 257/432 |
| 2016/0056200 A1* | 2/2016 | Lee | H01L 27/1464 250/208.1 |
| 2016/0133865 A1* | 5/2016 | Yamaguchi | H01L 51/4213 257/40 |
| 2016/0172412 A1* | 6/2016 | Lee | H01L 27/14605 257/432 |
| 2016/0276386 A1* | 9/2016 | Hsu | H01L 27/14627 |
| 2016/0276394 A1* | 9/2016 | Chou | H01L 27/14636 |
| 2017/0012066 A1* | 1/2017 | Choi | H01L 27/1464 |
| 2017/0047367 A1* | 2/2017 | Lee | H01L 27/14627 |
| 2017/0098673 A1* | 4/2017 | Nomura | H01L 27/14605 |
| 2017/0170238 A1* | 6/2017 | Lee | H01L 27/14621 |
| 2018/0053796 A1* | 2/2018 | Baek | H01L 27/1464 |
| 2018/0090533 A1* | 3/2018 | Otake | H01L 27/14627 |
| 2018/0158850 A1* | 6/2018 | Wu | H01L 27/14685 |
| 2018/0190690 A1* | 7/2018 | Lee | H01L 27/1464 |
| 2018/0190696 A1* | 7/2018 | Lee | H01L 27/14623 |
| 2018/0190707 A1* | 7/2018 | Lee | H01L 27/14645 |
| 2018/0213142 A1* | 7/2018 | Usui | H04N 5/3696 |
| 2018/0219046 A1* | 8/2018 | Yamaguchi | H01L 27/14647 |
| 2018/0286922 A1* | 10/2018 | Togashi | H01L 21/76898 |
| 2018/0308892 A1* | 10/2018 | Kumano | H01L 27/14643 |
| 2018/0366504 A1* | 12/2018 | Jin | G01S 7/4914 |
| 2018/0366519 A1* | 12/2018 | Saito | H01L 27/307 |
| 2019/0052823 A1* | 2/2019 | Jung | H01L 27/14645 |
| 2019/0131349 A1* | 5/2019 | Im | H01L 27/14665 |
| 2019/0148423 A1* | 5/2019 | Park | H01L 27/14603 257/291 |
| 2019/0157336 A1* | 5/2019 | Kim | H01L 27/14625 |
| 2019/0189818 A1* | 6/2019 | Chen | H01L 27/14692 |
| 2019/0206917 A1* | 7/2019 | Nakaji | H01L 27/14689 |
| 2019/0214427 A1* | 7/2019 | Nozawa | H01L 27/14643 |
| 2019/0221597 A1* | 7/2019 | Noh | H01L 27/14636 |
| 2019/0296070 A1* | 9/2019 | Jin | H01L 27/14603 |
| 2019/0305028 A1* | 10/2019 | Soda | H01L 23/49822 |
| 2019/0312075 A1* | 10/2019 | Yamamoto | H04N 5/369 |
| 2020/0058549 A1* | 2/2020 | Choi | H01L 21/76898 |
| 2020/0091215 A1* | 3/2020 | Jang | H01L 27/14634 |
| 2020/0103511 A1* | 4/2020 | Jin | H01L 27/1463 |
| 2020/0105810 A1* | 4/2020 | Moon | H01L 27/14689 |
| 2020/0185439 A1* | 6/2020 | Jin | G11C 11/5607 |
| 2020/0243590 A1* | 7/2020 | Yamagishi | H01L 27/14634 |
| 2020/0335540 A1* | 10/2020 | Sugizaki | H01L 27/14625 |
| 2021/0057371 A1* | 2/2021 | Park | H01L 27/307 |
| 2021/0057478 A1* | 2/2021 | Lee | H01L 27/14636 |
| 2021/0066367 A1* | 3/2021 | Jin | G01S 17/08 |
| 2021/0167107 A1* | 6/2021 | Sugizaki | H01L 27/14612 |
| 2021/0192685 A1* | 6/2021 | Nomura | H04N 9/04559 |
| 2021/0280617 A1* | 9/2021 | Sugizaki | H01L 27/1462 |
| 2022/0028913 A1* | 1/2022 | Tateishi | G01S 17/931 |
| 2022/0123032 A1* | 4/2022 | Lee | H01L 27/14636 |
| 2022/0150430 A1* | 5/2022 | Kim | H01L 27/14609 |

* cited by examiner

IMAGE SENSOR AND IMAGING DEVICE

CROSS-REFERENCE TO RELATED APPLICATION(S)

This application claims benefit of priority under 35 U.S.C. § 119 to Korean Patent Application No. 10-2019-0025716 filed on Mar. 6, 2019 in the Korean Intellectual Property Office, the disclosure of which is incorporated herein by reference in its entirety.

BACKGROUND

Some example embodiments of the inventive concepts relate to an image sensor and an imaging device.

Image sensors include semiconductor-based sensors that receive light to generate an electrical signal. An image sensor may include a pixel array, having a plurality of pixels, a logic circuit configured to drive the pixel array to generate an image, and the like. Recently, research into an imaging devices combining a light source outputting an optical signal within a specific wavelength band and with an image sensor has been actively conducted. In the case of an imaging device using a light source, it may be difficult to precisely detect an optical signal emitted from a light source and reflected from a subject in an environment in which the intensity of ambient light, such as sunlight, is high. Accordingly, performance may be deteriorated.

SUMMARY

Some example embodiments of the inventive concepts provide an image sensor and imaging device which may efficiently generate charges in response an optical signal within a specific wavelength band, in which sunlight intensity is low, to precisely recognize a subject even in an environment in which sunlight intensity is high.

According to some example embodiments of the inventive concepts, an image sensor may include a semiconductor substrate including a plurality of pixel regions, a first surface, and a second surface opposing the first surface, a plurality of transistors adjacent to the first surface of the semiconductor substrate in each of the plurality of pixel regions, a microlens on the second surface of the semiconductor substrate, and a plurality of conductive patterns in contact with the semiconductor substrate and closer to the second surface of the semiconductor substrate than to the first surface of the semiconductor substrate in each of the plurality of pixel regions.

According to some example embodiments of the inventive concepts, an image sensor may include a plurality of pixel regions, each of the plurality of pixel regions including at least one respective photodiode, a plurality of microlenses on the semiconductor substrate, each of the plurality of pixel regions including a respective microlense among the plurality of microlenses, and a plurality of conductive patterns in contact with the semiconductor substrate, each respective conductive pattern among the plurality of conductive patterns being between the at least one respective photodiode and the respective microlens.

According to some example embodiments of the inventive concepts, an imaging device may include a light source configured to output an optical signal within a determined wavelength band, and an image sensor configured to generate a pixel signal in response to receiving the optical signal reflected by an object, the image sensor including, a semiconductor substrate including a plurality of pixel regions, a plurality of microlenses on a surface of the semiconductor substrate on which the optical signal reflected by the object is incident, and a plurality of conductive patterns on the surface of the semiconductor substrate and in contact with the semiconductor substrate.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Hereinafter, some example embodiments of the inventive concepts will be described with reference to the accompanying drawings.

Figure 1:
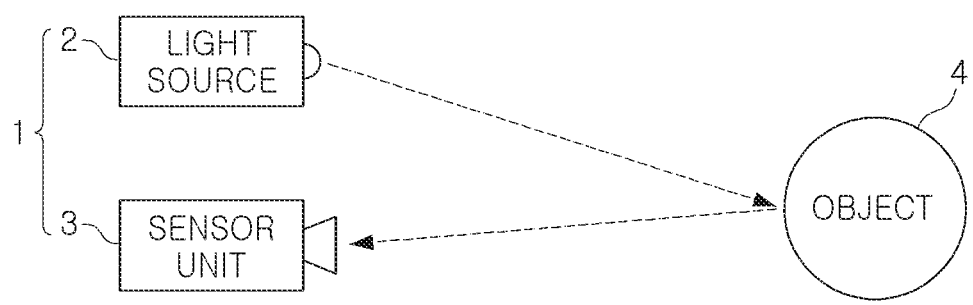
FIGS. 1 and 2 illustrate an imaging device according to some example embodiments of the inventive concepts.
Figure 2:
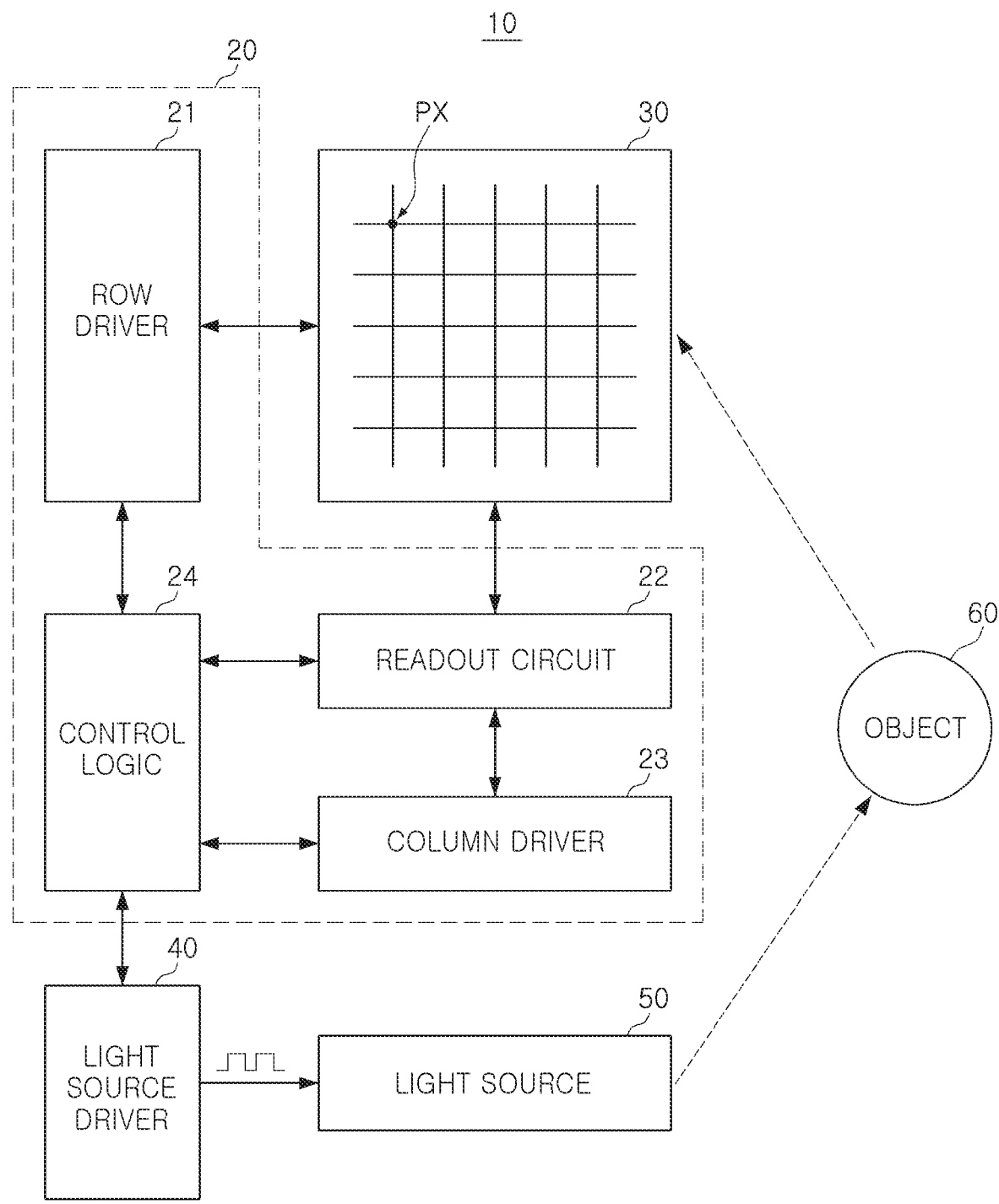

FIGS. 1 and 2 illustrate an imaging device according to some example embodiments of the inventive concepts.

Referring to FIG. 1, an imaging device 1 according to an example embodiment may include a light source 2 and/or a sensor unit 3. The light source 2 may include a light emitting element configured to output an optical signal within a specific wavelength band. As an example, the light source 2 may include a vertical cavity surface emitting laser (VC-SEL), a light emitting diode (LED), and/or the like, as a light emitting element. The light source 2 may include a plurality of light emitting elements arranged in an array format. An optical element may be further provided on a path of travel of an optical signal output by the plurality of light emitting elements. An optical signal, output by the light source 2, may be an optical signal of an infrared wavelength band.

The optical signal, output by the light source 2, may be reflected by an object 4, and the sensor unit 3 may receive the optical signal reflected by the object 4 as a received optical signal. The sensor unit 3 may include a pixel array, having pixels generating (e.g., configured to generate) an electrical signal in response to the received optical signal, a controller configured to generate an image using the electrical signal generated by the pixel array, and/or the like. As an example, the image generated by the controller may be a depth map including distance information of the object 4 and/or a surrounding environment of the object 4.

In an example embodiment, the sensor unit 3 may provide a function to generate a depth map as well as a proximity sensing function to sense existence of the object 4 proximate to the imaging device 1, a distance measuring function to calculate a distance between the object 4 and the imaging device 1, and/or the like. While, the sensor unit 3 may detect the received optical signal output by the light source 2 and reflected from the object 4, the above-mentioned functions may be more precisely implemented. Specifically, the sensor unit 3 may not precisely detect a received optical signal in an environment having severe interference of ambient light, such as sunlight, or the like. Accordingly, performance of the imaging device 1 may be degraded.

Sunlight is distributed over a wide wavelength band and generally has relatively low intensity in infrared bands. Most of the sunlight may be absorbed to (e.g., absorbed or attenuated by) moisture in atmosphere in a specific wavelength band. Thus, the light source 2 may be implemented using a light emitting element configured to output an optical signal of the specific wavelength band to improve performance of the imaging device 1. In an example embodiment, the specific wavelength band may be a short-wavelength infrared (SWIR) band around 1400 nm.

However, when the light source 2 outputs an optical signal of the specific wavelength band (e.g., the SWIR band), a silicon-based image sensor may be unable or less able to detect the optical signal of the specific wavelength band. In order to address the issue, an image sensor may be implemented with another semiconductor material other than silicon (Si). However, process difficulty may be increased as compared to the silicon-based image sensor resulting in increased manufacturing costs.

Example embodiments provide a silicon-based image sensor which may detect the optical signal of the specific wavelength band (e.g., the SWIR band). Accordingly, the light source 2 may be used to output the optical signal of the specific wavelength band in which most sunlight is absorbed to moisture in the atmosphere, or the like, and the imaging device 1 may be implemented to stably operate irrespective of the intensity of the sunlight.

Referring to FIG. 2, the imaging device 10 may include a controller 20, a pixel array 30, a light source driver 40, and/or a light source 50.

The pixel array 30 may include a plurality of pixels PX arranged in an array format along a plurality of rows and a plurality of columns. Each of the plurality of pixels PX may include a photodiode configured to generate charges in response to an optical signal incident from an object 60, a pixel circuit configured to generate an electrical signal corresponding to the charge generated by the photodiode, and/or the like. As an example, a pixel circuit may include a floating diffusion, a transfer transistor, a reset transistor, a drive transistor, a select transistor, and/or the like. Each of the pixels PX may have a configuration varying depending on example embodiments. As an example, each of the pixels PX may include an organic photodiode containing an organic material, unlike a silicon photodiode, or may be implemented as a digital pixel. When each of the pixels PX is implemented as a digital pixel, each of the pixels PX may include a comparator, a counter configured to convert an output of the comparator into a digital signal and transmit the digital signal, and/or the like.

The controller 20 may include a plurality of circuits for controlling the pixel array 30. As an example, the controller 20 may include a row driver 21, a readout circuit 22, a column driver 23, a control logic 24, and/or the like. The row driver 21 may drive the pixel array 30 in units of rows. For example, the row driver 21 may generate a transfer control signal for controlling a transfer transistor of a pixel circuit, a reset control signal controlling a reset transistor, a select control signal controlling a select transistor, and/or the like.

The readout circuit 22 may include a correlated double sampler (CDS), an analog-to-digital converter (ADC), and/or the like. The CDS may be connected to pixels PX, included in a row selected by a row select signal provided by the row driver 21, through column lines and may perform correlated double sampling to detect a reset voltage and a pixel voltage. The ADC may convert the reset voltage and the pixel voltage detected by the CDS into a digital signal, and may transmit the digital signal to the column driver 23.

The column driver 23 may include a latch and/or a buffer circuit configured to temporarily store a digital signal, an amplifier circuit, and/or the like, and may process a digital signal received from the readout circuit 22. The row driver 21, the readout circuit 22, and/or the column driver 23 may be controlled by the control logic 24. The control logic 24 may include a timing controller configured to control operating timing, an image signal processor configured to process image data, and/or the like.

The control logic 24 may process data output by the readout circuit 22 and the column driver 23 to generate image data. As an example, the image data may include a depth map. The control logic 24 may calculate a distance between the object 60 and the imaging device 10, and/or may recognize whether the object 60 is proximate to the imaging device 10 depending on an operating mode of the imaging device 10, by using the data output by the readout circuit 22 and the column driver 23.

The imaging device 10 may include the light source 50 outputting (e.g., configured to output) an optical signal to the object 60 to generate a depth map. The light source 50 may include at least one light emitting element. As an example, the light source 50 may include a semiconductor chip in which a plurality of semiconductor light emitting elements are arranged in an array format. The light source 50 may be operated by the light source driver 40. The light source driver 40 may be controlled by the controller 20.

In an example embodiment, the light source driver 40 may generate a determined pulse signal to drive the light source 50. The light source driver 40 may determine a cycle, a duty ratio, duration, and/or the like of the pulse signal in response to a control command of the controller 20. As an example, the controller 20 may synchronize at least one signal, among signals input to the pixel array 30, with a pulse signal input to the light source 50. In an example embodiment, a signal synchronized with the pulse signal input to the light source 50 may be at least one signal among signals input to the pixel array 30 by the row driver 21. According to some example embodiments, operations described herein as being performed by the controller 20, the row driver 21, the readout circuit 22, the column driver 23, the light source driver, 40, the CDS and/or the ADC may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The light source 50 may output an optical signal within a specific wavelength band. In an example embodiment, the specific wavelength band may be an SWIR wavelength band around 1400 nm. Each of the pixels PX may include conductive patterns in direct contact with a semiconductor substrate to detect an optical signal of an SWIR wavelength band reflected from the object 60. As an example, a Schottky barrier may be formed on boundaries between the semiconductor substrate and the conductive patterns, and charges may be generated by the optical signal of the SWIR wavelength band.

Figure 3:
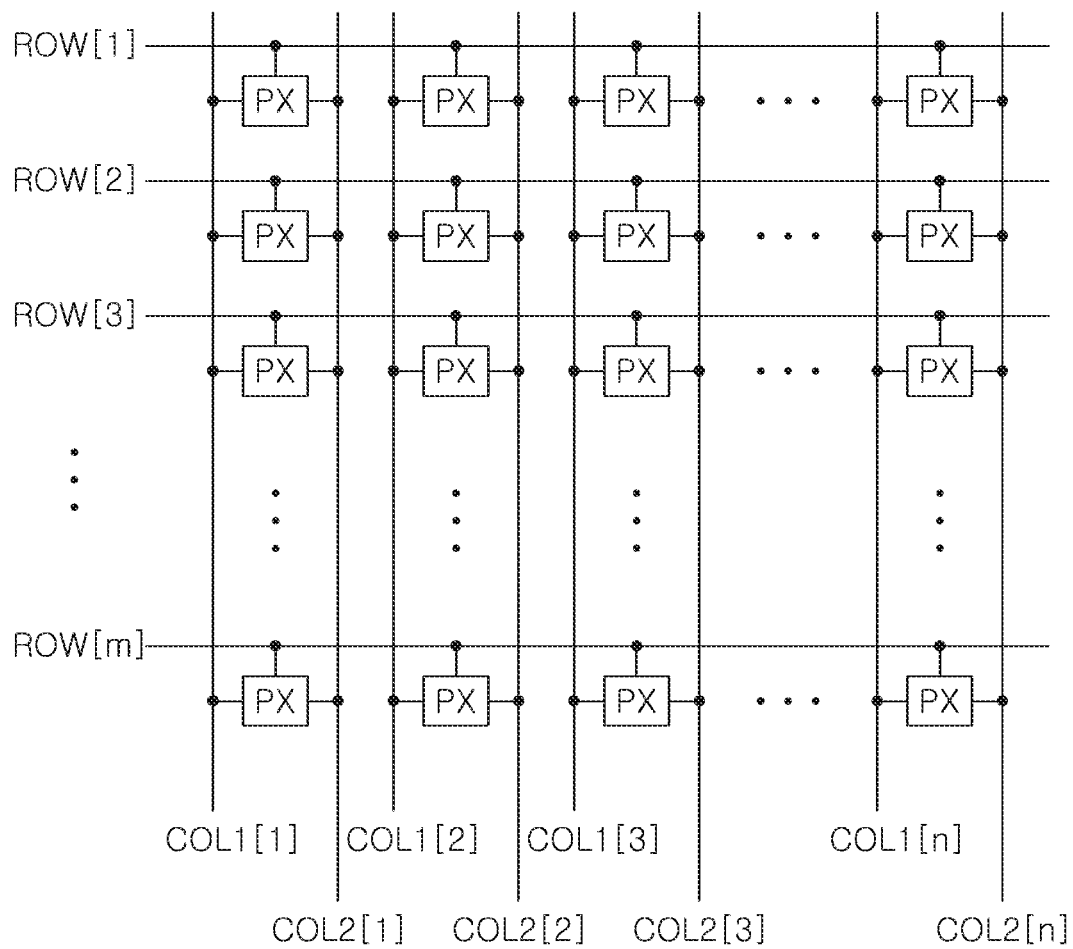
FIG. 3 illustrates a pixel array of an image sensor according to some example embodiments of the inventive concepts.

FIG. 3 illustrates a pixel array of an image sensor according to some example embodiments of the inventive concepts.

Referring to FIG. 3, a pixel array 30 according to an example embodiment may include a plurality of pixels PX. The plurality of pixels PX may be disposed at intersections of a plurality of row lines ROW[1] to ROW[m] (e.g., ROW[1], ROW[2], ROW[3] . . . ROW[m]) and a plurality of column lines COL1[1] to COL1[n] (e.g., COL1[1], COL1 [2], COL1[3] . . . COL1[n]) and COL2[1] to COL2[n] (e.g., COL2[1], COL2[2], COL2[3] . . . COL2[n]). In the example illustrated in FIG. 3, each of the pixels PX may be connected to one of the plurality of row lines ROW[1] to ROW[m] and to one of the plurality of second column lines COL2[1] to COL2[n].

Each of the plurality of pixels PX may include a photodiode, configured to generate charges in response to an optical signal received by the pixel array 30, and a pixel circuit configured to output an electrical signal using the charges generated by the photodiode. The pixel circuit may include a floating diffusion configured to accumulate the charges generated by the photodiode, a transfer transistor configured to connect the floating diffusion and the photodiode to each other, a reset transistor configured to reset the floating diffusion, a drive transistor configured to amplify a voltage of the floating diffusion, a select transistor configured to connect the driving transistor to one of the column lines COL1[1] to COL1[n] and COL2[1] to COL2[n], and/or the like.

When an optical signal output from a light source is reflected from an object and is incident on the pixel array 30, a photodiode of each of the pixels PX may generate charges in response to the incident optical signal. The optical signal output from the light source, and the received optical signal reflected from the object and incident on the pixel array 30, may have a determined phase difference. In an example embodiment, an imaging device may determine a distance between the imaging device and the object, and/or may sense proximity of the object using the phase difference, and/or may generate a depth map.

The imaging device may obtain an electrical signal corresponding to the generated charge for an integration time through a plurality of first column lines COL1[1] to COL1 [n] and a plurality of second column lines COL2[1] to COL2[n] connected to the plurality of pixels PX in a single frame. As an example, a transfer transistor, included in each of the plurality of pixels PX, is turned on and/or turned off using a transfer control signal having a phase difference of 180 degrees to obtain an electrical signal through the first column lines COL1[1] to COL1[n] and/or the second column lines COL2[1] to COL2[n].

Figure 4:
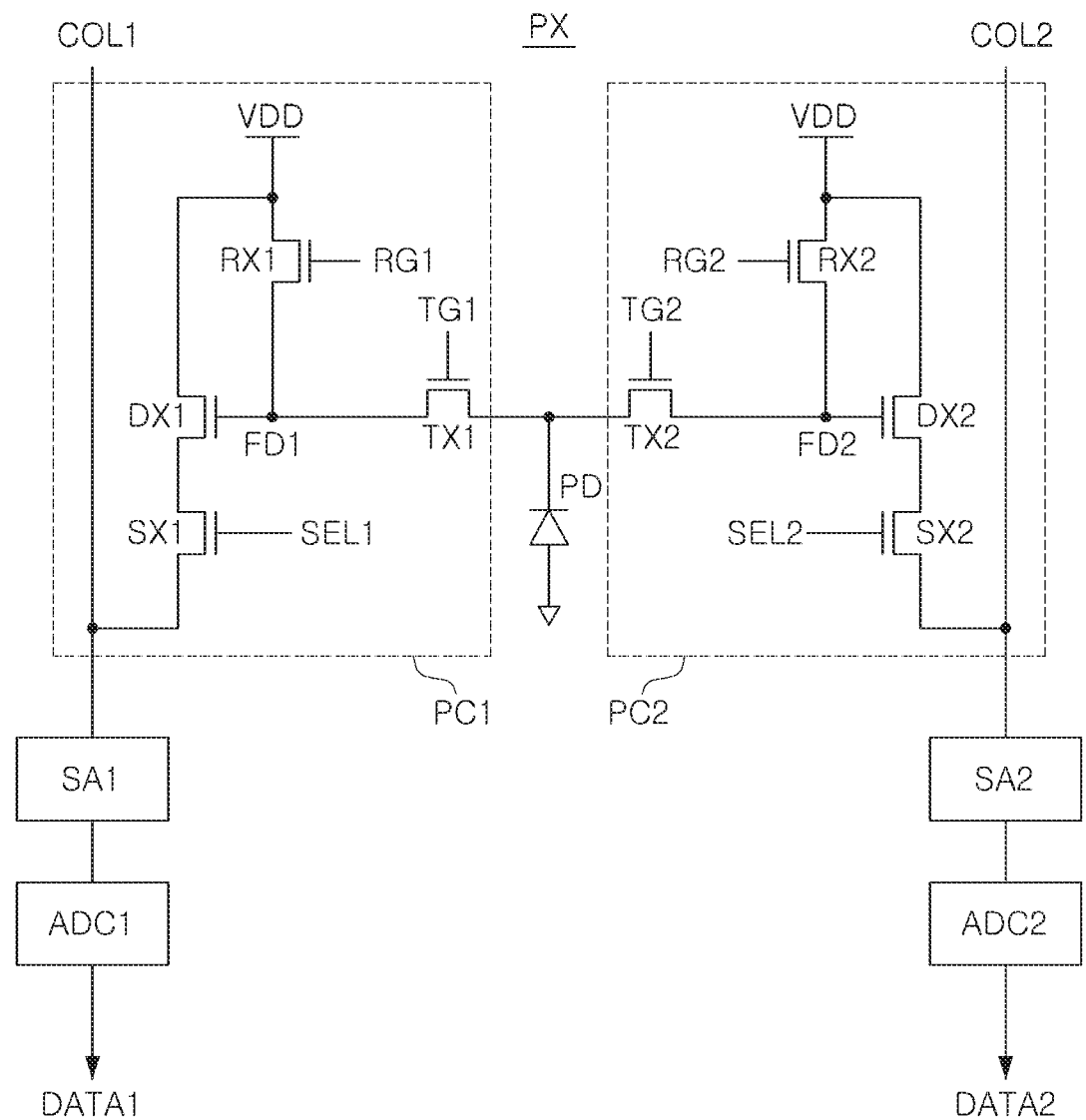
FIGS. 4 and 5 are circuit diagrams of a pixel circuit of an image sensor according to some example embodiments of the inventive concepts.
Figure 5:
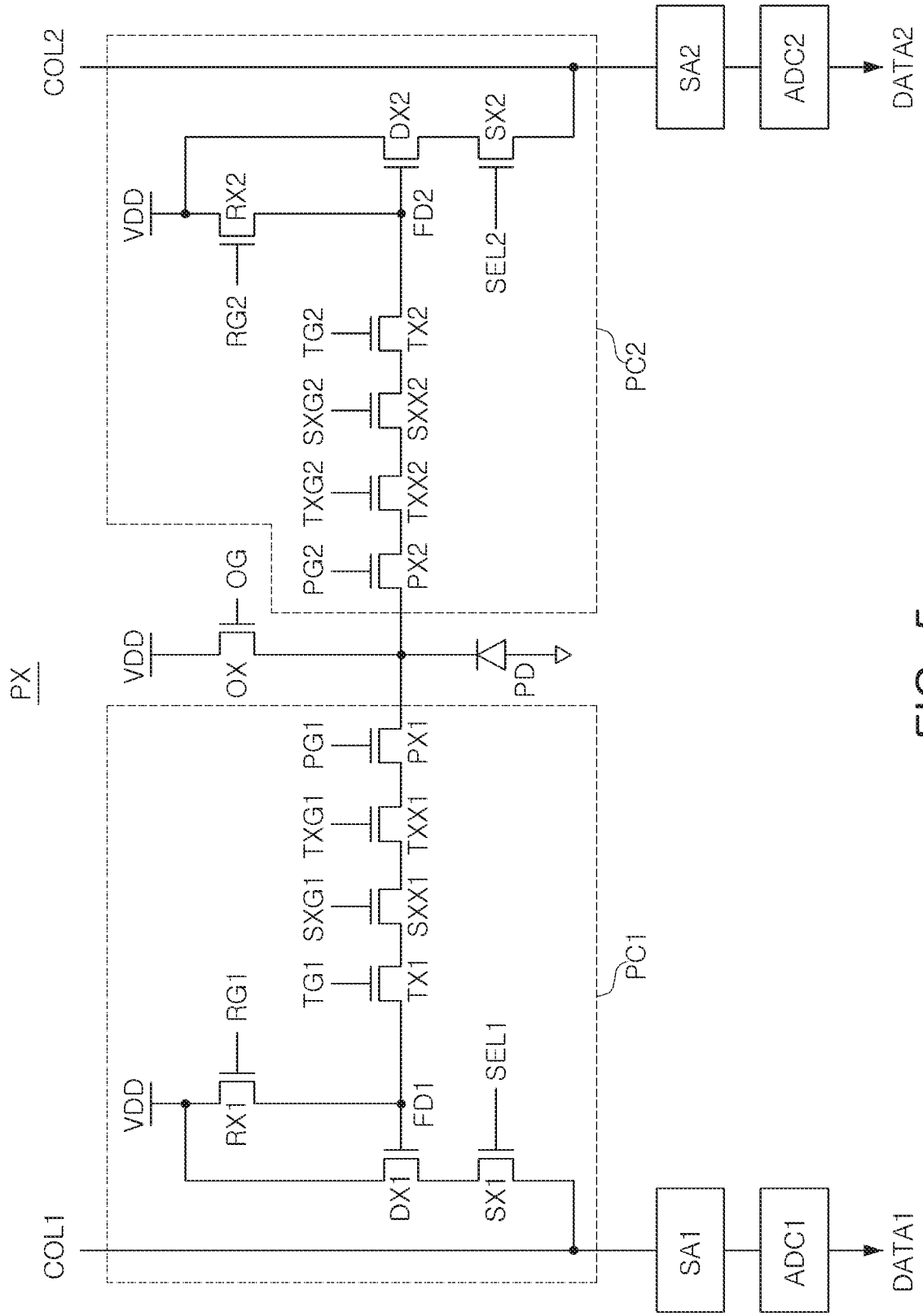

FIGS. 4 and 5 are circuit diagrams of a pixel circuit of an image sensor according to some example embodiments of the inventive concepts.

Referring to FIG. 4, a pixel PX of an imaging device according to an example embodiment may include a photodiode PD, configured to generate charges in response to an optical signal, and pixel circuits PC1 and PC2 configured to output an electrical signal corresponding to the pixel (e.g., charges) generated by the photodiode PD. The pixel circuits PC1 and PC2 may include a first pixel circuit PC1 and a second pixel circuit PC2. The first pixel circuit PC1 may be connected to a first sampling circuit SA1 and a first analog-to-digital converter ADC1 through a first column line COL1, and the second pixel circuit PC2 may be connected to a second sampling circuit SA2 and a second analog-to-digital converter ADC2 through a second column line COL2 (e.g., the same as or similar to the readout circuit 22).

The first pixel circuit PC1 may include a first transfer transistor TX1 connected to the photodiode PD, a first floating diffusion FD1 configured to accumulate charges generated by the photodiode PD, and a plurality of first circuit elements RX1, DX1, and SX1. The plurality of first circuit elements RX1, DX1, and SX1 may include a first reset transistor RX1, a first drive transistor DX1, and a first select transistor SX1. The second pixel circuit PC2 may have a structure similar to a structure of the first pixel circuit PC1. For example, the second pixel circuit PC2 may include a second floating diffusion FD2, a second reset transistor RX2, a second drive transistor DX2, and a second select transistor SX2. Control signals TG1, RG1, and SEL1 for controlling the first transfer transistor TX1, the first reset transistor RX1, and the first select transistor SX1, respectively, may be input by a row driver of an imaging device (e.g., from the row driver 21). Likewise, control signals TG2, RG2, and SEL2 for controlling the second transfer transistor TX2, the second reset transistor RX2, and the second select transistor SX2, respectively, may be input by the row driver of the imaging device (e.g., from the row driver 21).

When the first reset transistor RX1 is turned on, a voltage of the first floating diffusion FD1 may be reset to a power supply voltage VDD. The select transistor SX1 may be turned on, allowing the first sampling circuit SA1 to detect a first reset voltage. For a first exposure time, corresponding to a period from a first time at which the first reset transistor RX1 is turned off to second a time at which the first transfer transistor TX1 is turned on, the photodiode PD may be exposed to light to generate charges.

When the first transfer transistor TX1 is turned on, charges of the photodiode PD may be accumulated on the first floating diffusion FD1 and the first sampling circuit SA1 may detect a first pixel voltage in response to turn-on of the first select transistor SX1. A first analog-to-digital converter may convert a difference between the first reset voltage and the first pixel voltage into first raw data DATA1 in a digital format.

An operation of the second pixel circuit PC2 may be similar to an operation of the first pixel circuit PC1. However, the second transfer transistor TX2 may not be turned on simultaneously or contemporaneously with the first transfer transistor TX1. Accordingly, a second pixel voltage, output through the second column line COL2 by the second pixel circuit PC2, may correspond to a charge generated by exposing the photodiode PD2 to light for a second exposure time different from the first exposure time. A second analog-to-digital converter may convert a difference between a second reset voltage and a second pixel voltage into second raw data DATA2.

In an example embodiment, an imaging device may operate in a global shutter manner. As an example, after first and second reset transistors RX1 and RX2, included in respective pixels included in the imaging device, are all turned on to reset the pixels PX, photodiodes of the pixels PX may exposed for a determined exposure time to generate charges. A length of time of exposure of the photodiode PD to light may vary depending on an operating mode of the imaging device. For the time of exposure, the first transfer transistor TX1 and the second transfer transistor TX2 may be alternately turned on and turned off and may be controlled in synchronization with a driving signal of a light source actually operating in the imaging device.

As an example, for a first time, a first transfer control signal TG1, input to the first transfer transistor TX1, may have the same phase or a similar phase as the driving signal of the light source and a second transfer control signal TG2, input to the second transfer transistor TX2, may have a phase difference of 180 degrees with the driving signal of the light source. For a second time following the first time, the first transfer control signal TG1 may have a phase difference of 90 degrees with the driving signal of the light source and the second transfer control signal TG2 may have a phase difference of 270 degrees with the driving signal of the light source. An image sensor may recognize an object and/or may determine a distance to the object by using first raw data DATA1 and second raw data DATA2, obtained for the first time, and first raw data DATA2 and second raw data DATA2 obtained for the second time. As an example, each of the first and second times may be a frame period of the image sensor.

Referring to FIG. 5, a pixel PX of the imaging device according to an example embodiment may include a photodiode PD and a first pixel circuit PC1 and a second pixel circuit PC2 configured to output an electrical signal corresponding to a charge generated by the photodiode PD. The first pixel circuit PC1 may be connected to a first sampling circuit SA1 and a first analog-to-digital converter ADC1 through a first column line COL1, and the second pixel circuit PC2 may be connected to a second sampling circuit SA2 and a second analog-to-digital converter ADC2 through a second column line COL2.

The photodiode PD may be connected to a power supply node, outputting (e.g., configured to output) a power supply voltage VDD, through an overflow transistor OX. The overflow transistor OX may be turned on and turned off by an overflow control signal OG to prevent or reduce saturation of the photodiode PD.

Compared with the example illustrated in FIG. 4, in the example illustrated in FIG. 5, the first pixel circuit PC1 may further include a first photo transistor PX1, a first intermediate transfer transistor TXX1, and a first storage transistor SXX1. The first photo transistor PX1 may be connected to the photodiode PD, and the first intermediate transfer transistor TXX1 and the first storage transistor SXX1 may be connected between the first photo transistor PX1 and the first transfer transistor TX1. According to example embodiments, the first intermediate transfer transistor TXX1 and the first storage transistor SXX1 may be implemented as a single transistor, or gates of the first intermediate transfer transistor TXX1 and the first storage transistor SXX1 may be controlled by a single control signal. The second pixel circuit PC2 may have a structure similar to a structure of the first pixel circuit PC1. For example, the second pixel circuit PC2 may include a second photo transistor PX2 connected to the photodiode PD, and a second intermediate transfer transistor TXX2 and second storage transistor SXX2 connected between the second photo transistor PX1 and the second transfer transistor TX2. Control signals PG1, TXG1, and SXG1 for controlling the first photo transistor PX1, the first intermediate transfer transistor TXX1, and the first storage transistor SXX1, respectively, may be input by a row driver of an imaging device. Likewise, control signals PG2, TXG2, and SXG2 for controlling the second photo transistor PX2, the second intermediate transfer transistor TXX2, and the second storage transistor SXX2, may be input by the row driver of the imaging device.

In the example illustrated in FIG. 5, charges generated by the photodiode PD may be distributed to the first storage transistor SXX1 and the second storage transistor SXX2 before being stored therein. The first photo transistor PX1 and the second photo transistor PX2 may be alternately turned on and turned off. While the first photo transistor PX1 is turned on, charges generated by the photodiode PD may be stored in the first storage transistor SXX1. While the second photo transistor PX2 is turned on, charges generated by the photodiode PD may be stored in the second storage transistor SXX2.

The first pixel circuit PC1 may transfer the charges, stored in the first storage transistor SXX1, to a first floating diffusion FD1 to generate first raw data DATA1. The second pixel circuit PC2 may transfer the charges, stored in the second storage transistor SXX2, to a second floating diffusion FD2 to generate second raw data DATA2. A method of measuring a distance to an object and/or recognizing the object using the first raw data DATA1 and the second raw data DATA2 may be the same as or similar to that described with reference to FIG. 4.

Figure 6:
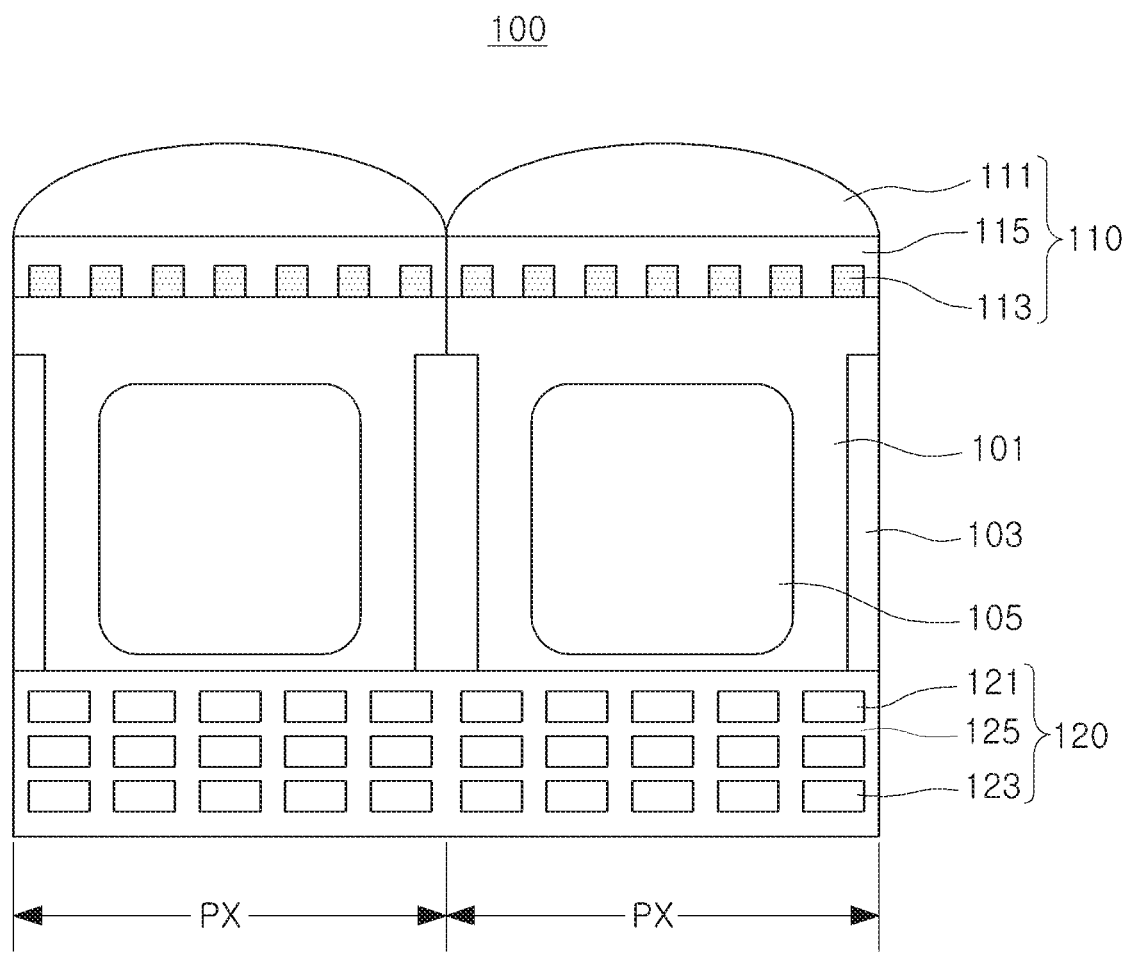
FIG. 6 is a cross-sectional view illustrating pixels of an image sensor according to some example embodiments of the inventive concepts.

FIG. 6 is a cross-sectional view illustrating pixels of an image sensor according to some example embodiments of the inventive concepts.

In an example embodiment, an image sensor 100 may include a plurality of pixels PX arranged in an array format. Referring to FIG. 6, the image sensor 100 may include a semiconductor substrate 101 provided with a plurality of pixel regions, and a plurality of pixels PX may be formed in the plurality of pixel regions.

A photodiode 105 may be disposed in a semiconductor substrate 101, and each of the plurality of pixels PX may include at least one photodiode 105. Although FIG. 6 illustrates the pixels PX, each having a single photodiode 105, each of the pixels PX may include two or more photodiodes 105. A pixel isolation layer 103 may be disposed between the plurality of pixels PX (e.g., to prevent or reduce crosstalk).

The semiconductor substrate 101 may have a first surface, and a second surface, opposing the first surface. In the example illustrated in FIG. 6, the first surface may be a surface, on which a pixel circuit region 120 is formed, and the second surface may be a surface on which an optical region 110 is formed. The pixel circuit region 120 may include a plurality of transistors 121, interconnection lines 123 for connecting at least some of the transistors 121 to each other, a circuit insulating layer 125, and/or the like. As an example, the plurality of transistors 121 may include a reset transistor configured to provide a pixel circuit, a transfer transistor, a drive transistor, a select transistor, a photo transistor, a storage transistor, and/or the like.

The optical region 110, formed on the second surface, may receive externally introduced light. The optical region 110 may include a microlens 111, conductive patterns 113, an optical insulating layer 115, and/or the like. The microlens 111 may be disposed in each of the pixels PX to refract the externally introduced light. The optical insulating layer 115 may include a filter and/or a planarized layer.

The conductive patterns 113 may be formed of at least one of a metal material, a metal silicide material, and/or a transparent conductive material and may be in direct contact with the semiconductor substrate 101. The conductive patterns 113 may be disposed between the microlens 111 and the photodiode 105, and may be disposed closer to the second surface than to the first surface of the semiconductor substrate 101.

The conductive patterns 113 may be in direct contact with the semiconductor substrate 101 on the second surface. A Schottky barrier may be formed on boundaries between the conductive patterns 113 and the semiconductor substrate 101, and charges may be generated in the semiconductor substrate 101 by an infrared optical signal (e.g., a signal of a wavelength band of 1350 nm to 1450 nm). In this case, electrons may be generated as main charge carriers in the semiconductor substrate 101. Accordingly, an imaging device may be implemented to recognize an object and/or to measure a distance to the object by coupling a light source, configured to output an optical signal of an SWIR wavelength band in which most sunlight is absorbed to moisture in atmosphere, to an image sensor 100. In addition, performance of the imaging device may be improved.

Figure 7:
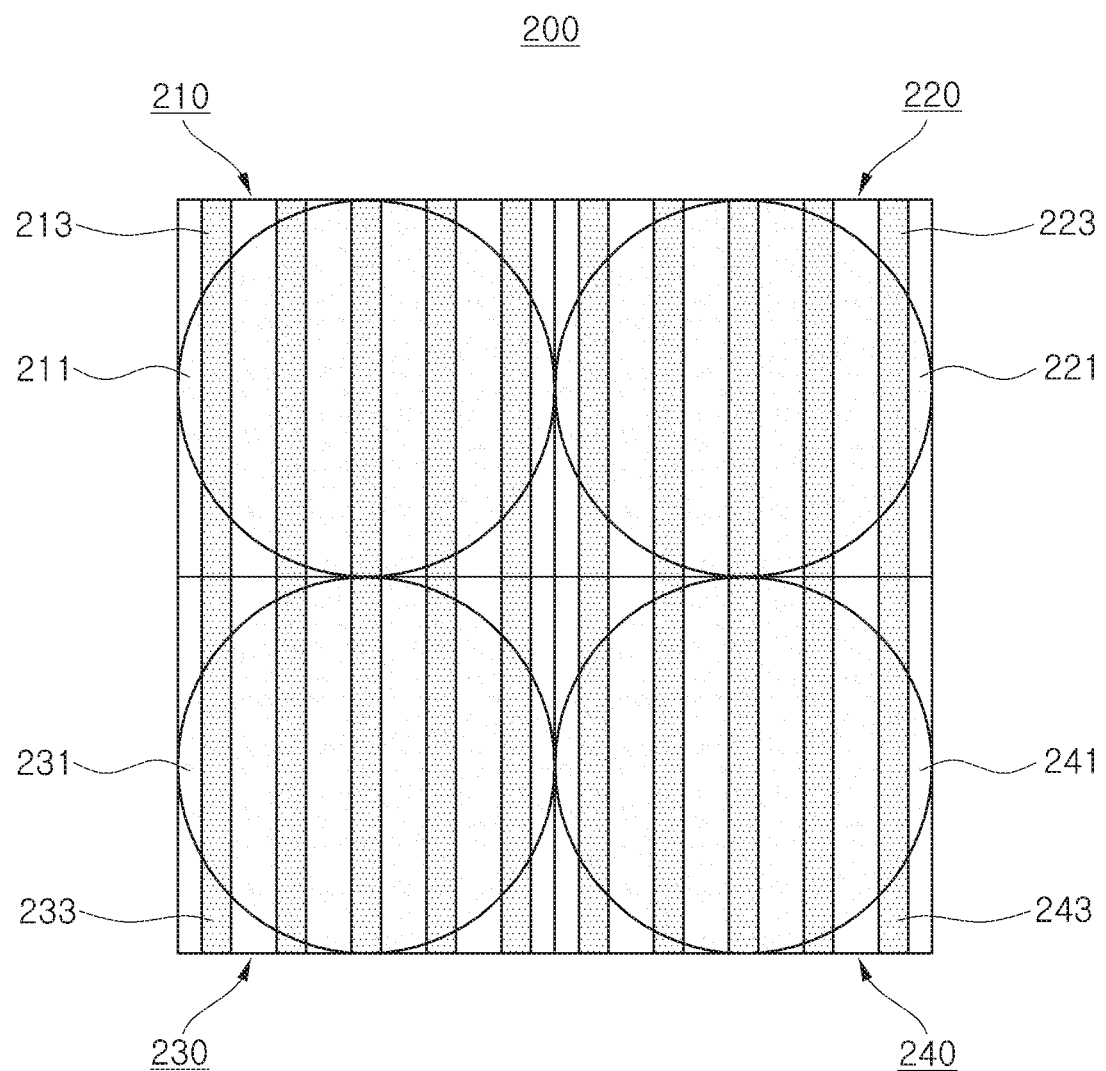
FIG. 7 is a plan view illustrating pixels of an image sensor according to some example embodiments of the inventive concepts.
Figure 8:
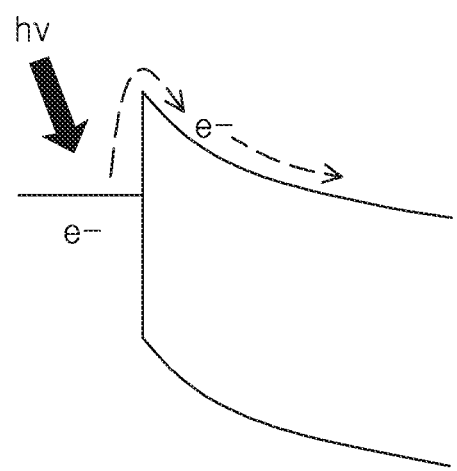
FIG. 8 illustrates the principle that charges are generated in an image sensor according to some example embodiments of the inventive concepts.

FIG. 7 is a plan view illustrating pixels of an image sensor according to some example embodiments of the inventive concepts, and FIG. 8 illustrates the principle that charges are generated in an image sensor according to some example embodiments of the inventive concepts.

Referring to FIG. 7, an image sensor 200 may include a plurality of pixels 210, 220, 230, and/or 240. The plurality of pixels 210, 220, 230, and/or 240 may include microlenses 211, 221, 231, and/or 241 and conductive patterns 213, 223, 233, and/or 243 disposed below the microlenses 211, 221, 231, and/or 241, respectively. In the example illustrated in FIG. 7, the conductive patterns 213, 223, 233, and/or 243 may be formed as stripe patterns.

Referring to FIG. 8, a Schottky barrier may be formed on boundaries between the conductive patterns 213, 223, 233, and/or 243 and a semiconductor substrate. Thus, electrons may be emitted as main charge carriers by an optical signal. The conductive patterns 213, 223, 233, and/or 243 may be formed of a metal material such as W, Al, Cu, Ti, TiN, Au, Pt, and/or the like, and/or a metal silicide material such as PtSi, WSi, TaSi, PdSi, TiSi, and/or the like. Alternatively or additionally, the conductive patterns 213, 223, 233, and/or 243 may be formed of a conductive nanomaterial such as a graphene, a carbon nanotube, and/or the like, and/or a conductive material such as ITO, IZO, ZnO, and/or the like.

Figure 9:
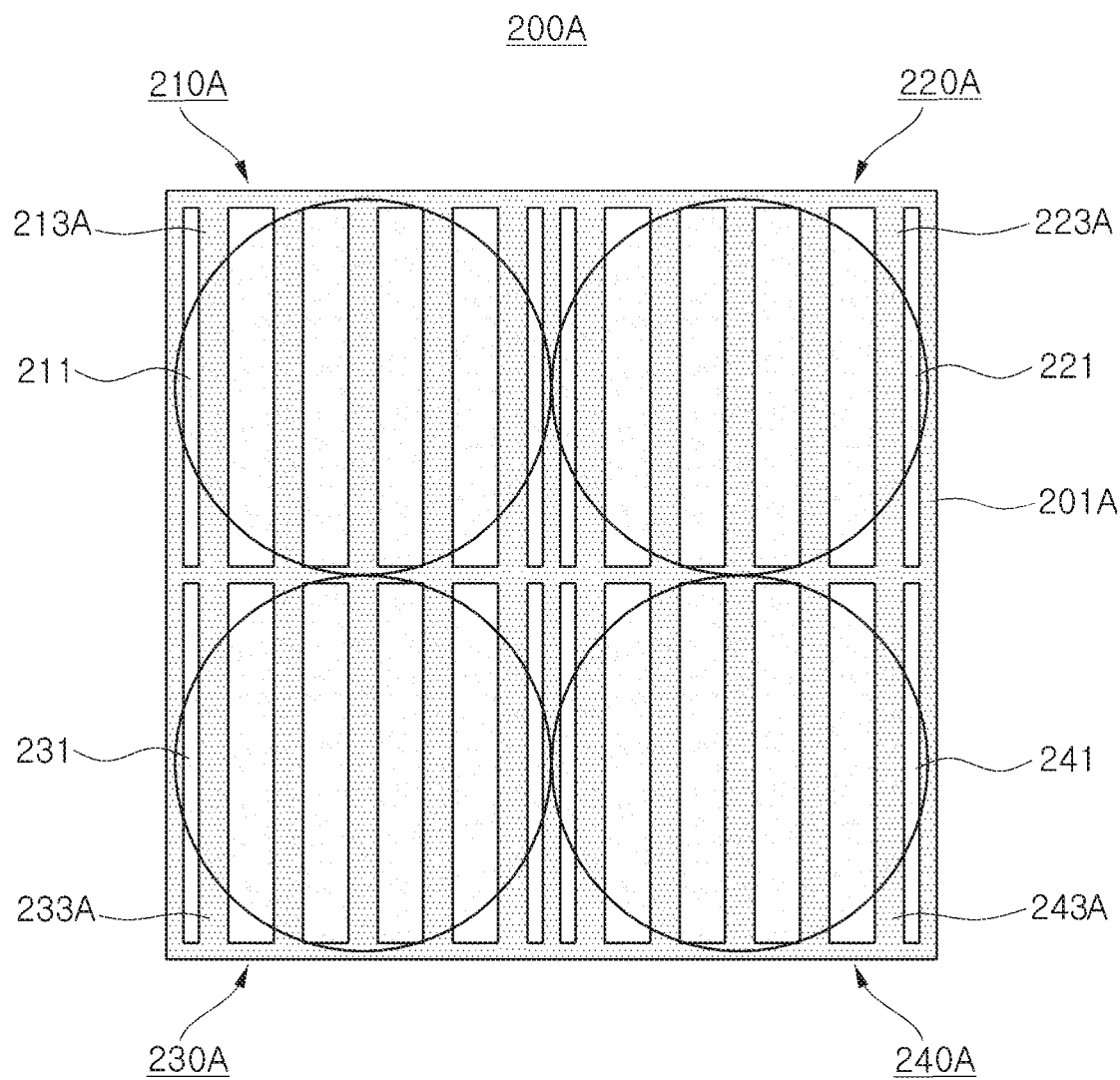
FIG. 9 is a plan view illustrating pixels of an image sensor including a pattern connection layer 201A according to some example embodiments of the inventive concepts.
Figure 10:
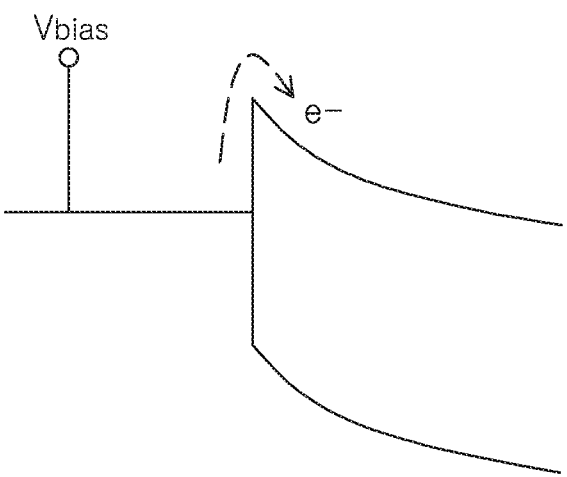
FIG. 10 illustrates the principle that charges are generated in an image sensor based on a bias voltage according to some example embodiments of the inventive concepts.

FIG. 9 is a plan view illustrating pixels of an image sensor including a pattern connection layer 201A according to some example embodiments of the inventive concepts, and FIG. 10 illustrates the principle that charges are generated in an image sensor based on a bias voltage according to some example embodiments of the inventive concepts.

Referring to FIG. 9, conductive patterns 213A, 223A, 233A, and/or 243A may be formed in a plurality of pixels 210A, 220A, 230A, and/or 240A, respectively. The conductive patterns 213A, 223A, 233A, and/or 243A may be stripe patterns. In the example illustrated in FIG. 9, the conductive patterns 213A, 223A, 233A, and/or 243A may be electrically connected to each other by a pattern connection layer 201A prepared outside of each of the pixels 210A, 220A, 230A, and/or 240A.

In the example illustrated in FIG. 9, a determined bias voltage may be input to the conductive patterns 213A, 223A, 233A, and/or 243A of the image sensor 200A. As an example, in the case in which electrons are generated as main charge carriers and a plurality of transistors, included in a pixel circuit region, may be n-channel metal-oxide-semiconductor field-effect transistors (MOSFETs) (e.g., NMOS transistors), a bias voltage may be a ground voltage or lower. On the other hand, in the case in which holes are generated as main charge carriers and a plurality of transistors, included in a pixel circuit region, are a plurality of p-channel metal-oxide-semiconductor field-effect transistors (MOSFETs) (e.g., PMOS transistors), a bias voltage may be a ground voltage or higher. Referring to FIG. 10, a bias voltage Vbias may be input to easily transfer electrons, generated by an optical signal, to a semiconductor substrate over a Schottky barrier and to improve performance of the image sensor 200A.

Figure 11:
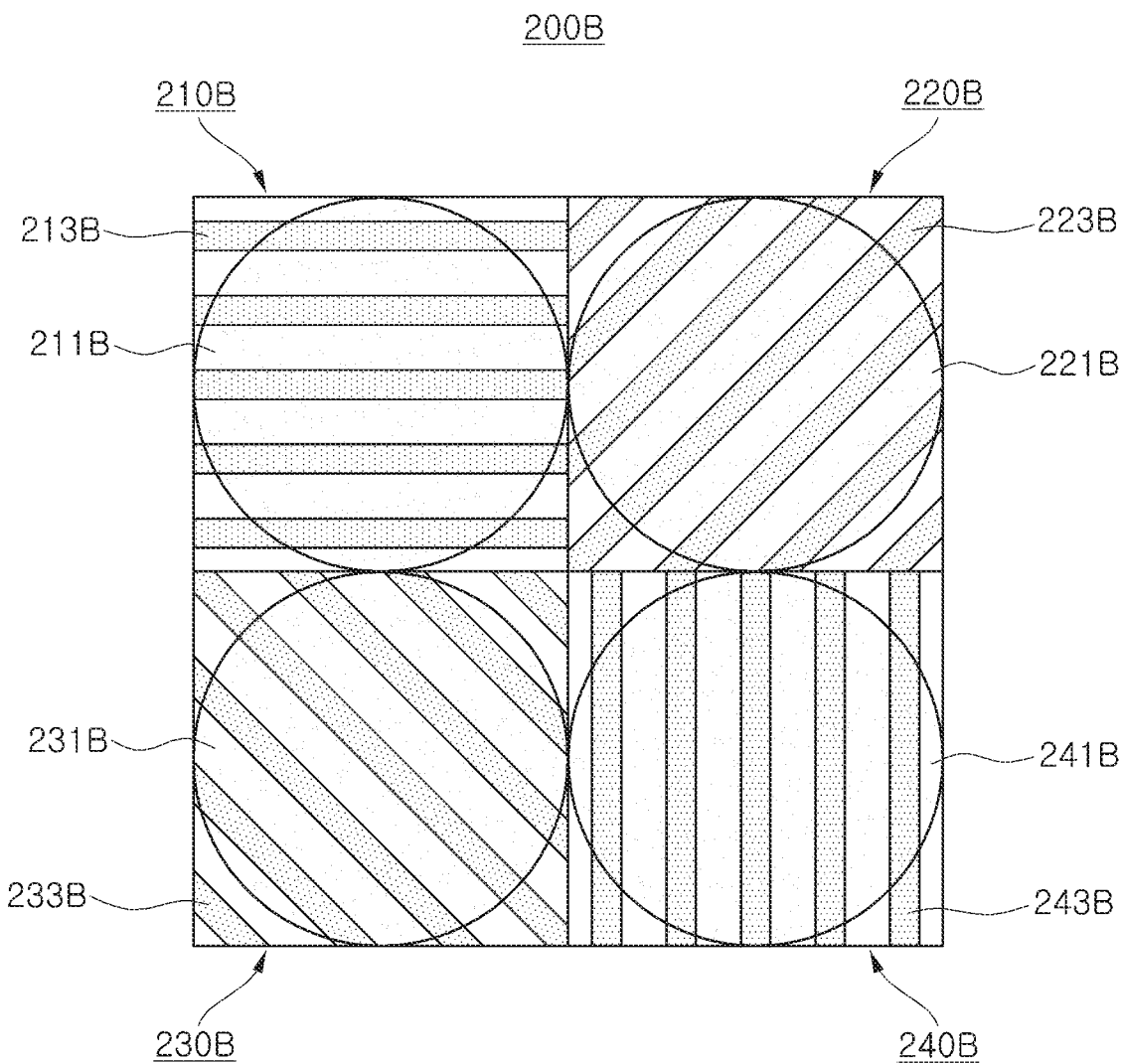
FIGS. 11 and 12 are plan views illustrating pixels of an image sensor having various types of conductive patterns according to some example embodiments of the inventive concepts.
Figure 12:
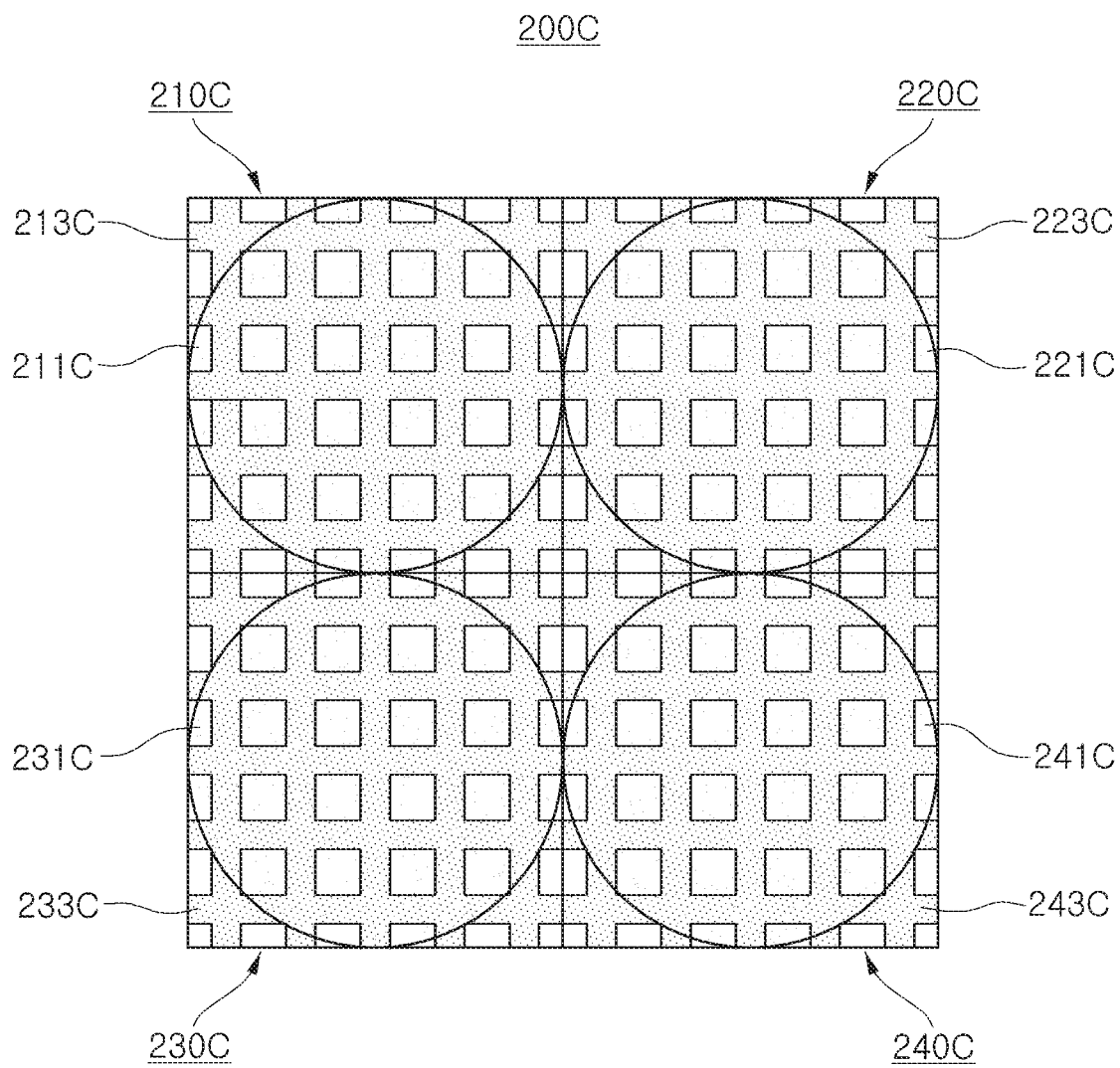

FIGS. 11 and 12 are plan views illustrating pixels of an image sensor having various types of conductive patterns according to some example embodiments of the inventive concepts.

Referring to FIG. 11, an image sensor 200B may include a plurality of pixels 210B, 220B, 230B, and/or 240B. The plurality of pixels 210B, 220B, 230B, and/or 240B may include microlenses 211B, 221B, 231B, and/or 241B and/or conductive patterns 213B, 223B, 233B, and/or 243B, respectively.

In the example illustrated in FIG. 11, conductive patterns 213B, 223B, 233B, and/or 243B, respectively included in adjacent pixels 210B, 220B, 230B, and/or 240B, may be stripe patterns extending in different directions. As an example, on the basis of first conductive patterns 213B disposed in a first pixel 210B, a second conductive pattern 223B may be a pattern rotated 45 degrees, a third conductive pattern 233B may be a pattern rotated 90 degrees, and a fourth conductive pattern 243B may be a pattern rotated 135 degrees. Accordingly, the image sensor 200B according to the example illustrated in FIG. 11 may eliminate or reduce mirror reflection, appearing on an image, and may implement a polarizing filter function using the conductive patterns 213B, 223B, 233B, and/or 243B.

Referring to FIG. 12, an image sensor 200C may include a plurality of pixels 210C, 220C, 230C, and/or 240C. The plurality of pixels 210C, 220C, 230C, and/or 240C may include microlenses 211C, 221C, 231C, and/or 241C and conductive patterns 213C, 223C, 233C, and/or 243C, respectively. In the example illustrated in FIG. 12, the conductive patterns 213C, 223C, 233C, and/or 243C may be grid patterns.

In the example illustrated in FIG. 12, the image sensor 200C may further include a pattern connection layer electrically connecting the conductive patterns 213C, 223C, 233C, and/or 243C to each other. The pattern connection layer may be disposed along boundaries between pixels 210C, 220C, 230C, and/or 240C, as described with reference to FIG. 9. The pattern connection may be formed, and a determined bias voltage may be input to the conductive patterns 213C, 223C, 233C, and/or 243C to improve charge generation efficiency of the image sensor 200C. The pattern connection layer may also be applied to the image sensor 200B according to the example illustrated in FIG. 11.

FIGS. 13A to 13E illustrate a first method of manufacturing an image sensor according to some example embodiments of the inventive concepts.

Figure 13A:
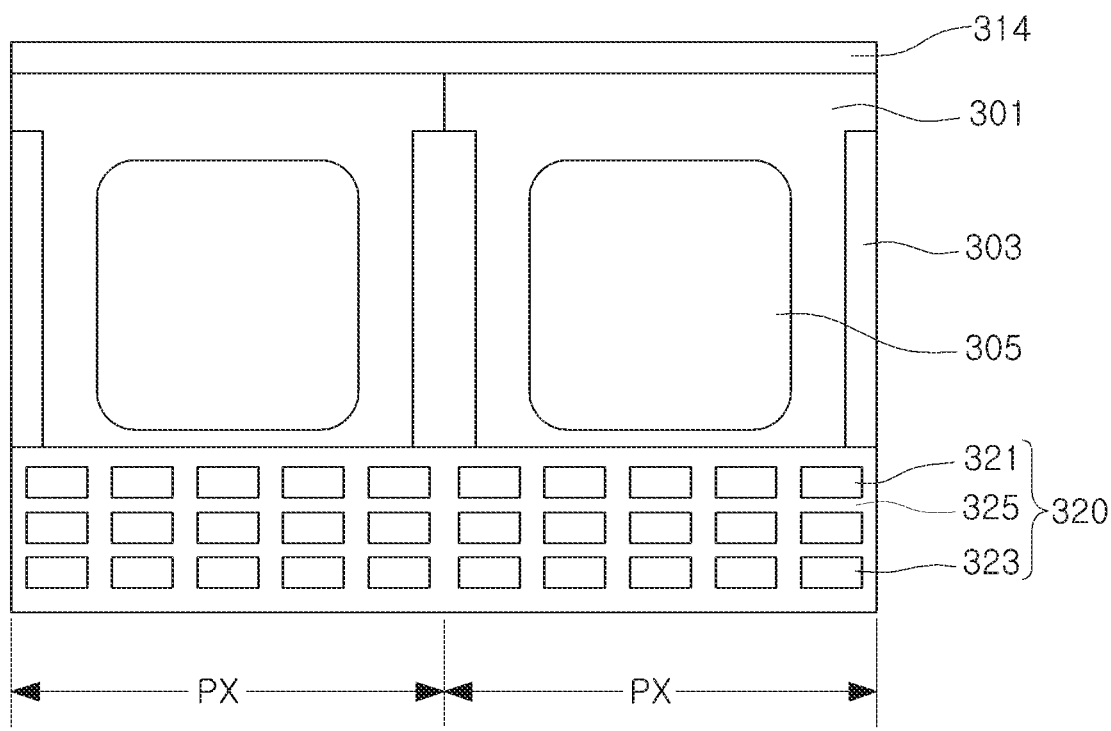
FIGS. 13A to 13E illustrate a first method of manufacturing an image sensor according to some example embodiments of the inventive concepts.

Referring to FIG. 13A, a pixel isolation layer 303 may be formed in a semiconductor substrate 301 to define a plurality of pixel regions, and a photodiode 305 may be formed in each of the plurality of pixel regions. The semiconductor substrate 301 may have a first surface, and a second surface, opposing the first surface, and a pixel circuit region 320 may be prepared on the first surface. The pixel circuit region 320 may include a plurality of transistors 321 configured to convert a charge generated by a photodiode 305 into an electrical signal, interconnection lines 323 connecting at least some of the plurality of transistors 321 to each other, a circuit insulating layer 325, and/or the like.

Figure 13B:
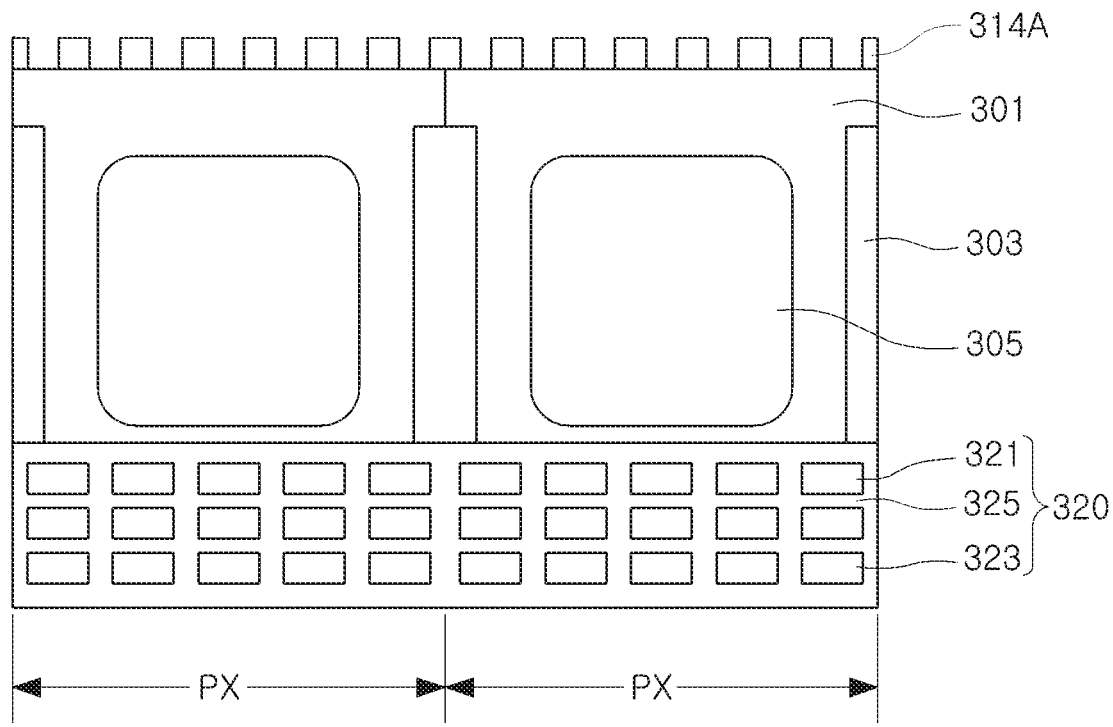

When the pixel circuit region 320 is formed, the semiconductor substrate 301 may be turned over to expose the second surface and a polishing process may be selectively performed. As illustrated in FIG. 13A, a mask layer 314 may be formed on the second surface of the semiconductor substrate 301. In an example embodiment, an aluminum oxide (AlO) layer, having negative fixed charge characteristics, and/or the like may be formed while forming the mask layer 314. Referring to FIG. 13B, a portion of the mask layer 314 may be removed using a photolithography process, an etching process, and/or the like to form mask patterns 314A.

Figure 13C:
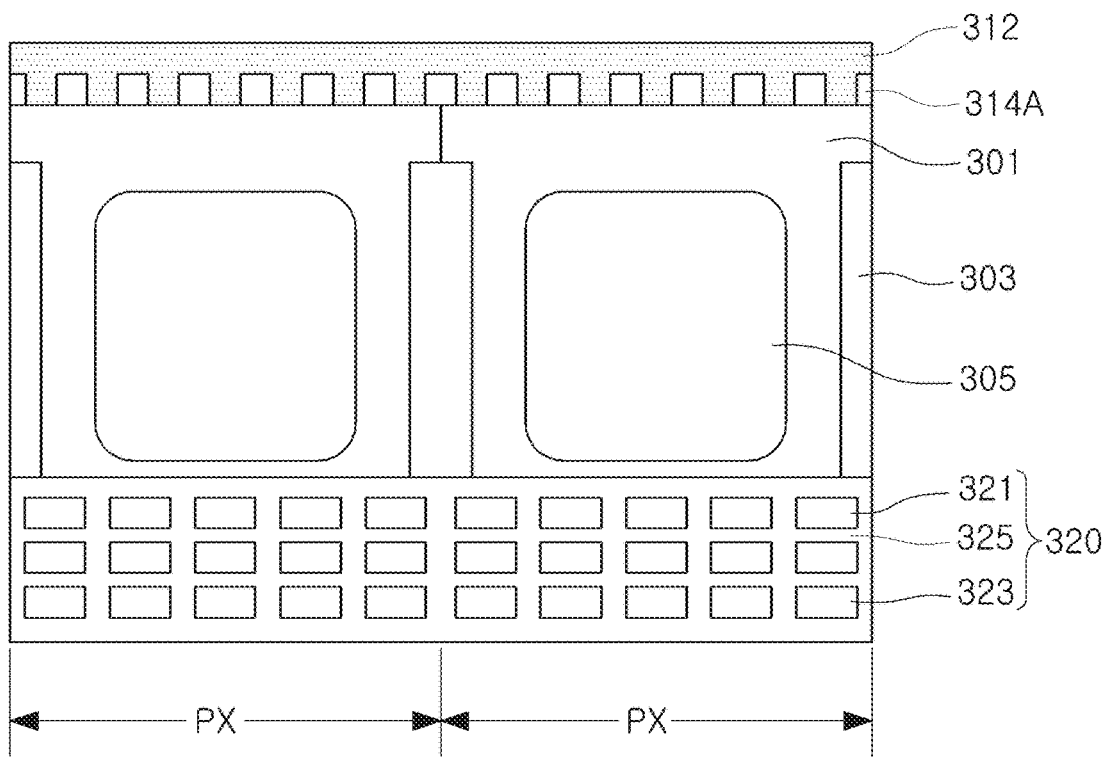
Figure 13D:
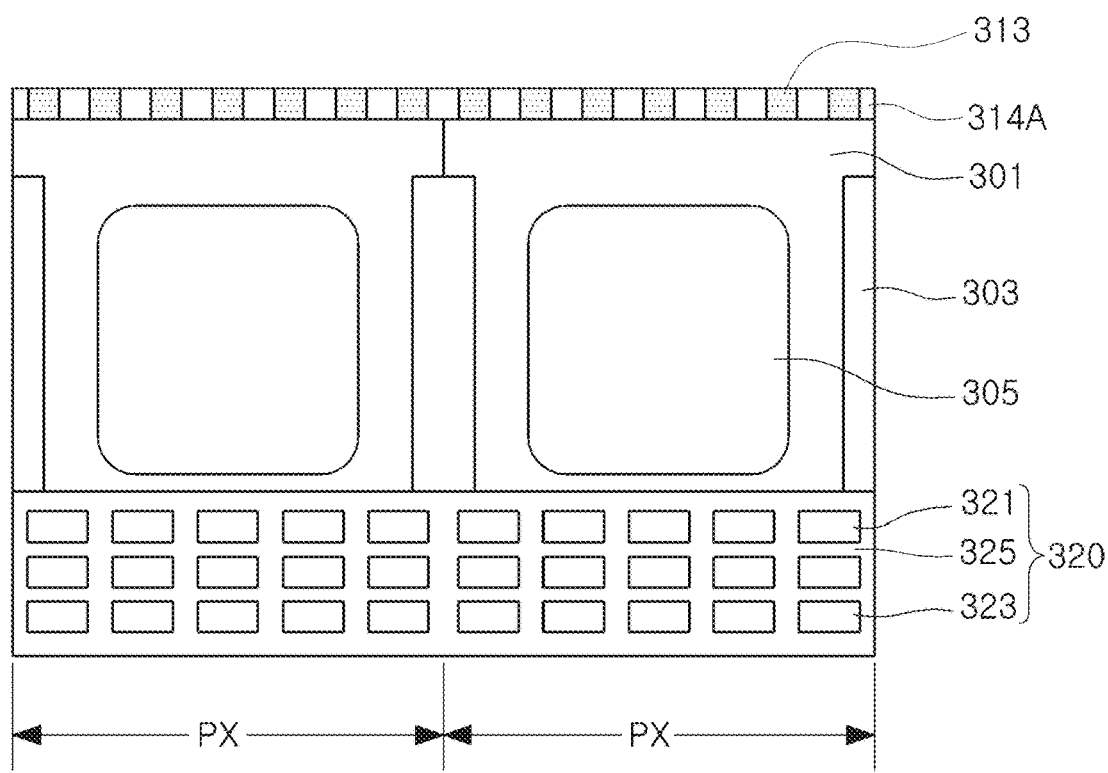

Referring to FIG. 13C, a conductive layer 312 may be formed on the second surface of the semiconductor substrate 301 where the mask patterns 314A are formed. The conductive layer 312 may be formed of a metal material, a metal silicide material, a transparent conductive material, and/or the like. The conductive layer 312 may be in direct contact with the semiconductor substrate 301 in a space between the mask patterns 314A. A polishing process, and/or the like, may be performed on the conductive layer 312 to form conductive patterns 313, as illustrated in FIG. 13D. Top surfaces of the conductive patterns 313 may be coplanar or substantially coplanar with top surfaces of the mask patterns 314A, as illustrated in FIG. 13D.

Figure 13E:
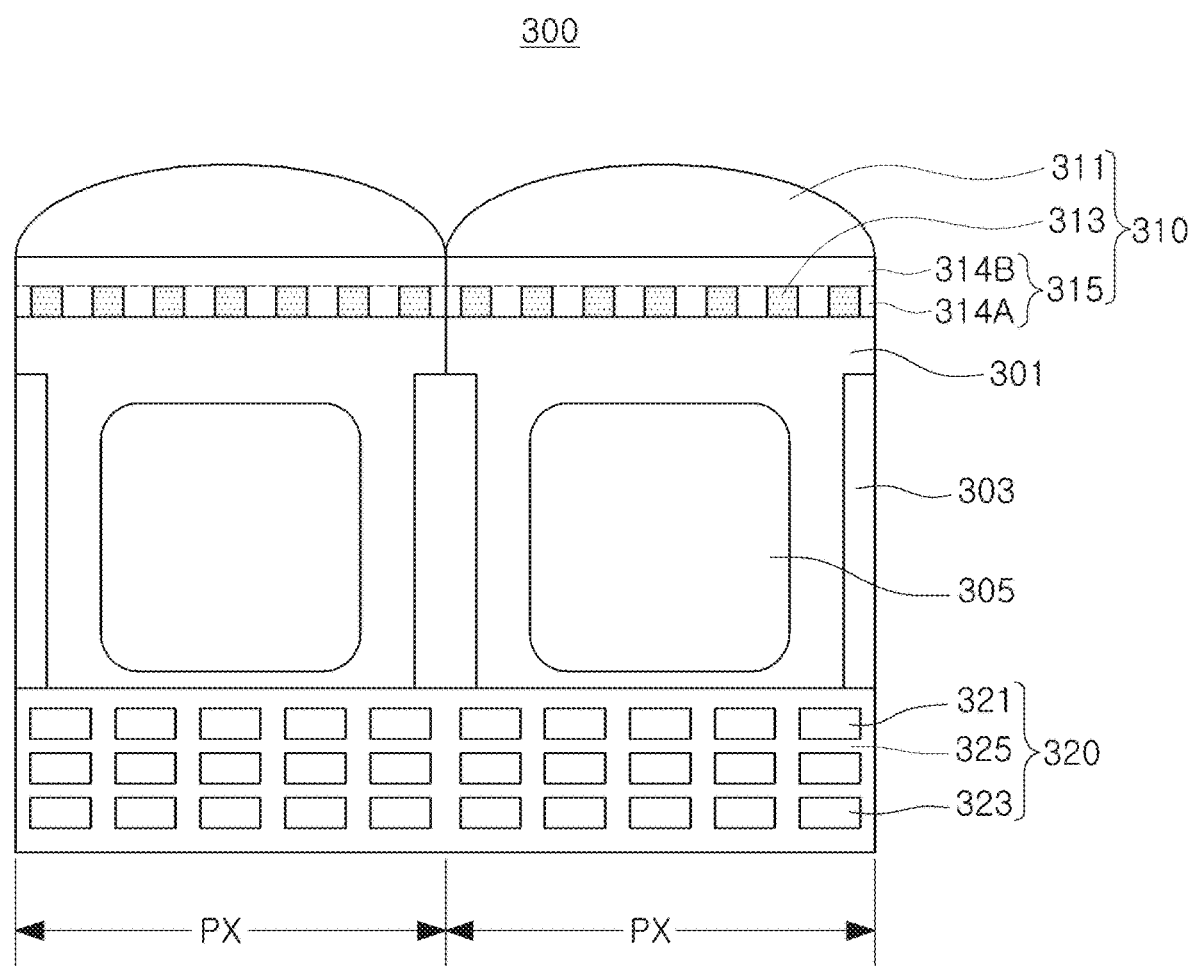

Referring to FIG. 13E, an insulating layer 314B may be additionally formed on the conductive patterns 313 and/or the mask patterns 314A, and a microlens 311 may be formed on the insulating layer 314B. The mask patterns 314A and/or the insulating layer 314B may provide an optical insulating layer 315. The microlens 311, the conductive patterns 313 and the optical insulating layer 315 may provide an optical region 310.

Figure 14A:
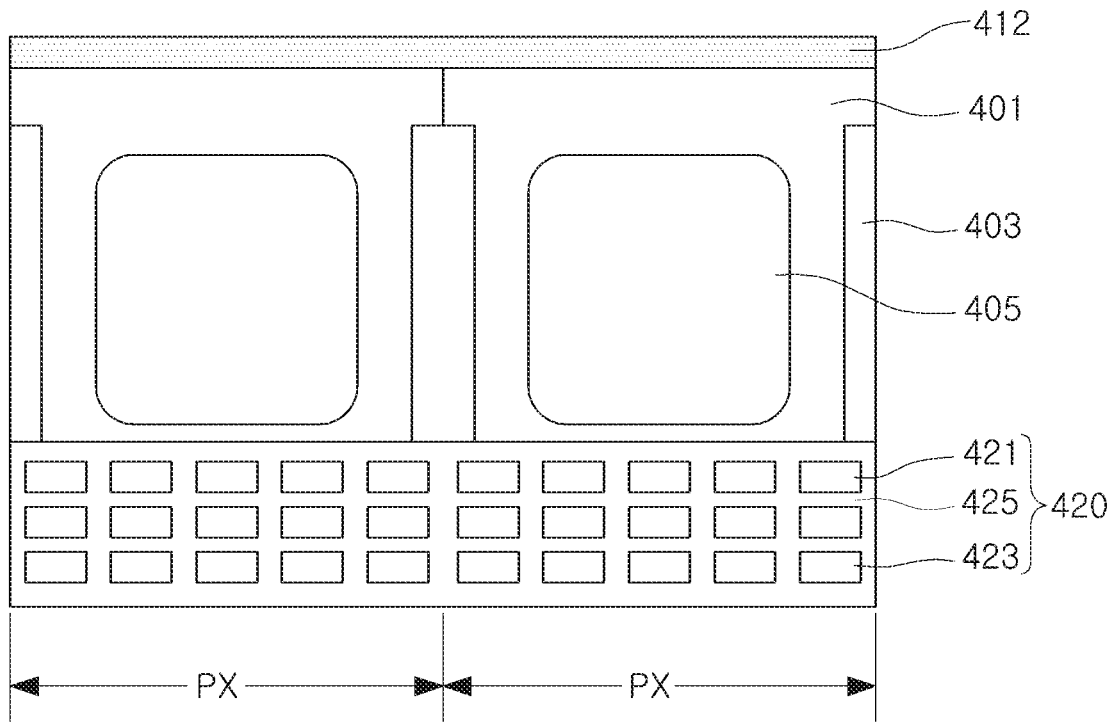
FIGS. 14A to 14C illustrate a second method of manufacturing an image sensor according to some example embodiments of the inventive concepts.
Figure 14B:
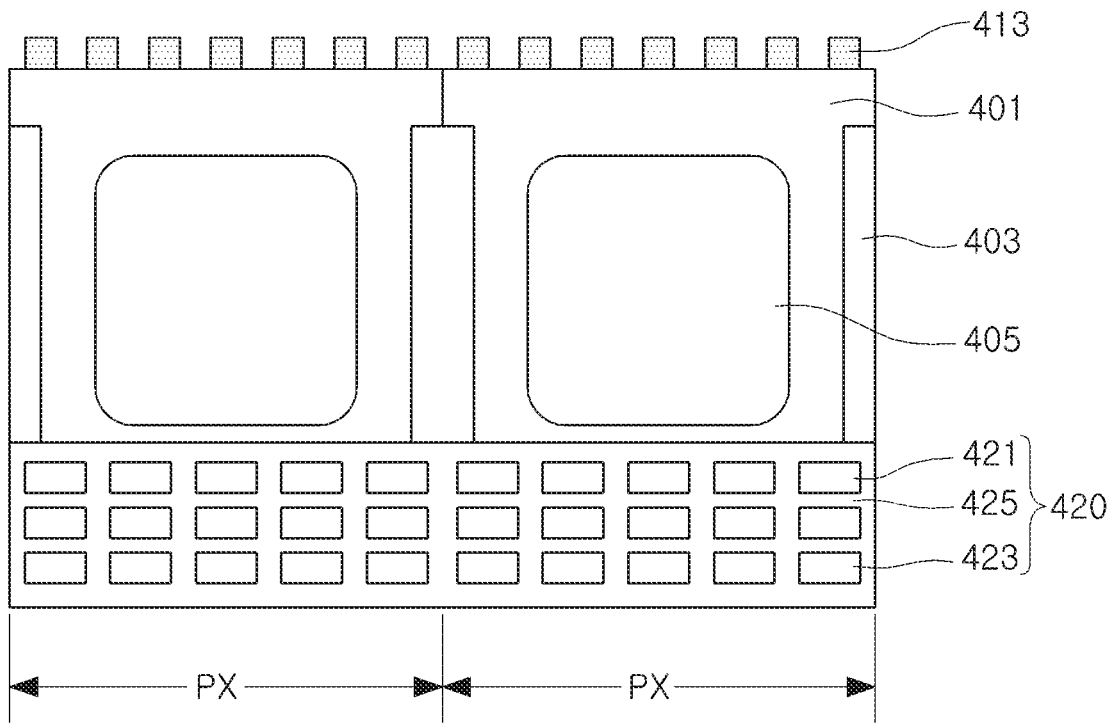
Figure 14C:
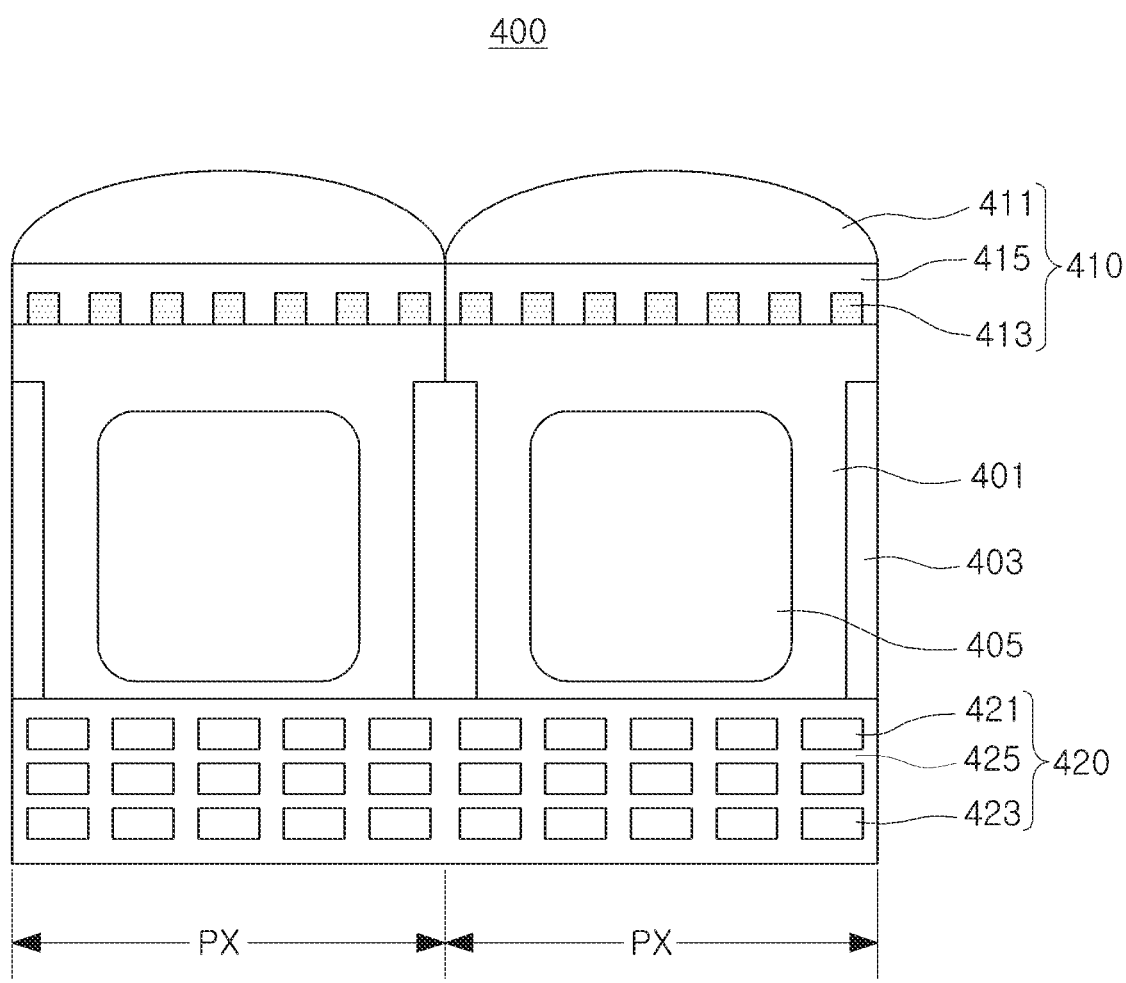

FIGS. 14A to 14C illustrate a second method of manufacturing an image sensor according to some example embodiments of the inventive concepts.

Referring to FIG. 14A, a pixel isolation layer 403 may be formed in a semiconductor substrate 401 to define a plurality of pixel regions, and a photodiode 405 may be formed in each of the plurality of pixel regions. The semiconductor substrate 401 may have a first surface, and a second surface, opposing the first surface, and a pixel circuit region 420 may be prepared on the first surface. The pixel circuit region 420 may include a plurality of transistors 421 configured to convert a charge generated by a photodiode 305 into an electrical signal, interconnection lines 423 connecting at least some of the plurality of transistors 421 to each other, a circuit insulating layer 425, and/or the like.

When the pixel circuit region 420 is formed, the semiconductor substrate 401 may be turned over to expose the second surface and, a polishing process may be selectively performed. As illustrated in FIG. 14A, a conductive layer 412 may be formed on the second surface of the semiconductor substrate 401. The conductive layer 412 may be formed of at least one of a metal material, a metal silicide material, a conductive nanomaterial, and/or a transparent conductive material.

Referring to FIG. 14B, the conductive layer 412 may be etched using a determined pattern to form conductive patterns 413. In an example embodiment, a determined mask pattern may be formed on the conductive layer 412, and a region of the conductive layer 412, exposed by the mask pattern, may be selectively removed to form the conductive patterns 413. After the conductive patterns 413 are formed, the mask pattern may be removed or remain.

Referring to FIG. 14C, an optical insulating layer 415 covering the conductive patterns 413, and a microlens 411 may be formed on the second surface of the semiconductor substrate 401. When the mask pattern, used to form the conductive patterns 413, remains, an insulating layer may be additionally formed on the mask pattern to form an optical insulating layer 415. The microlens 411, the conductive patterns 413, and the optical insulating layer 415 may provide an optical region 410 on the second surface of the semiconductor substrate 401.

Figure 15:
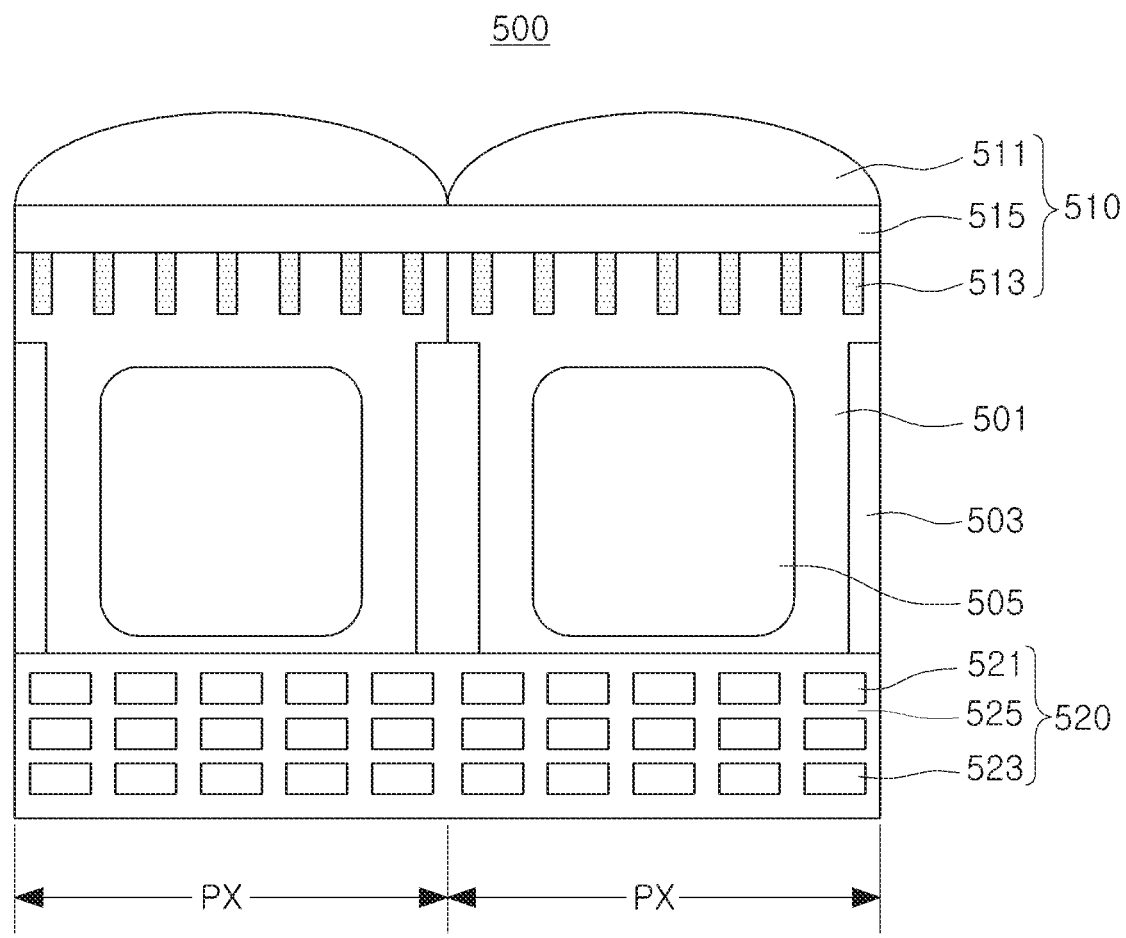
FIGS. 15 to 17 are cross-sectional views illustrating pixels of an image sensor including various types of conductive patterns and pixel isolation layers according to some example embodiments of the inventive concepts.
Figure 16:
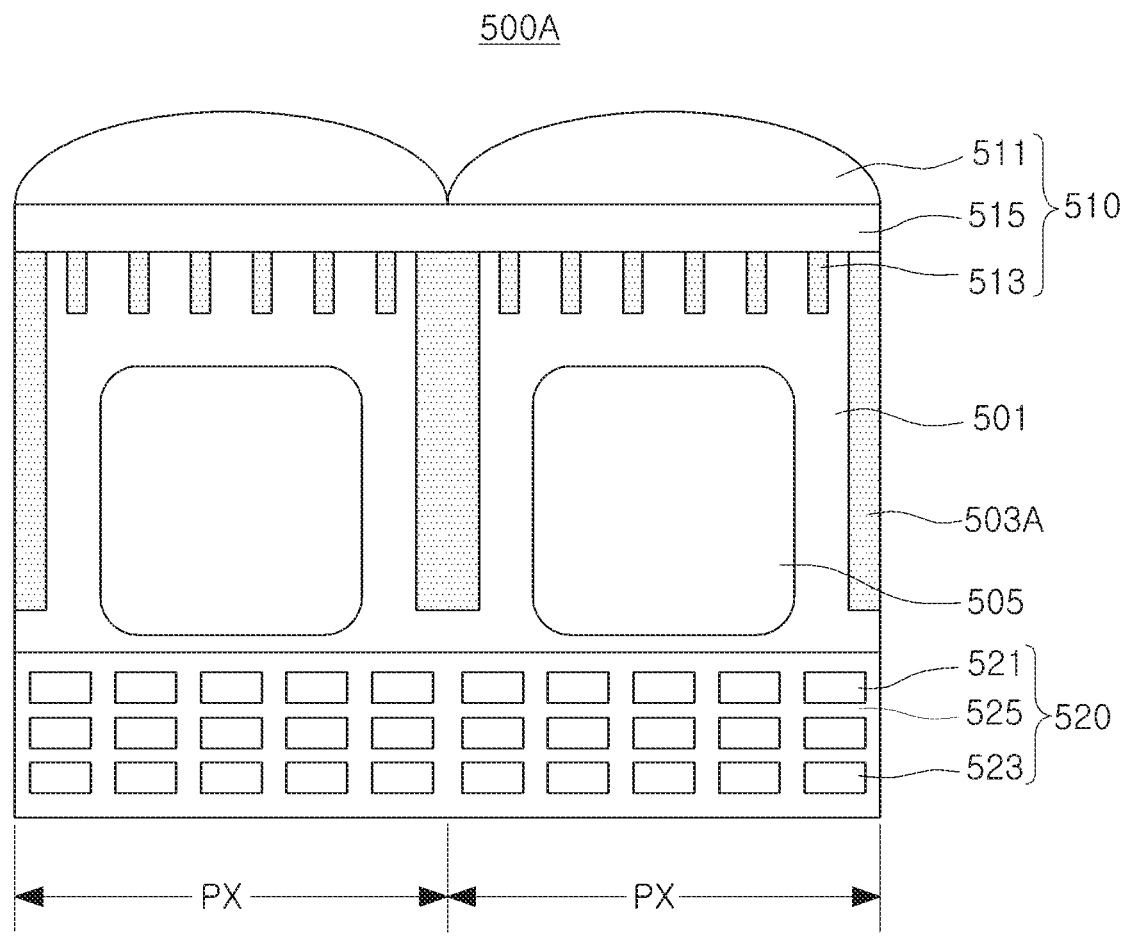
Figure 17:
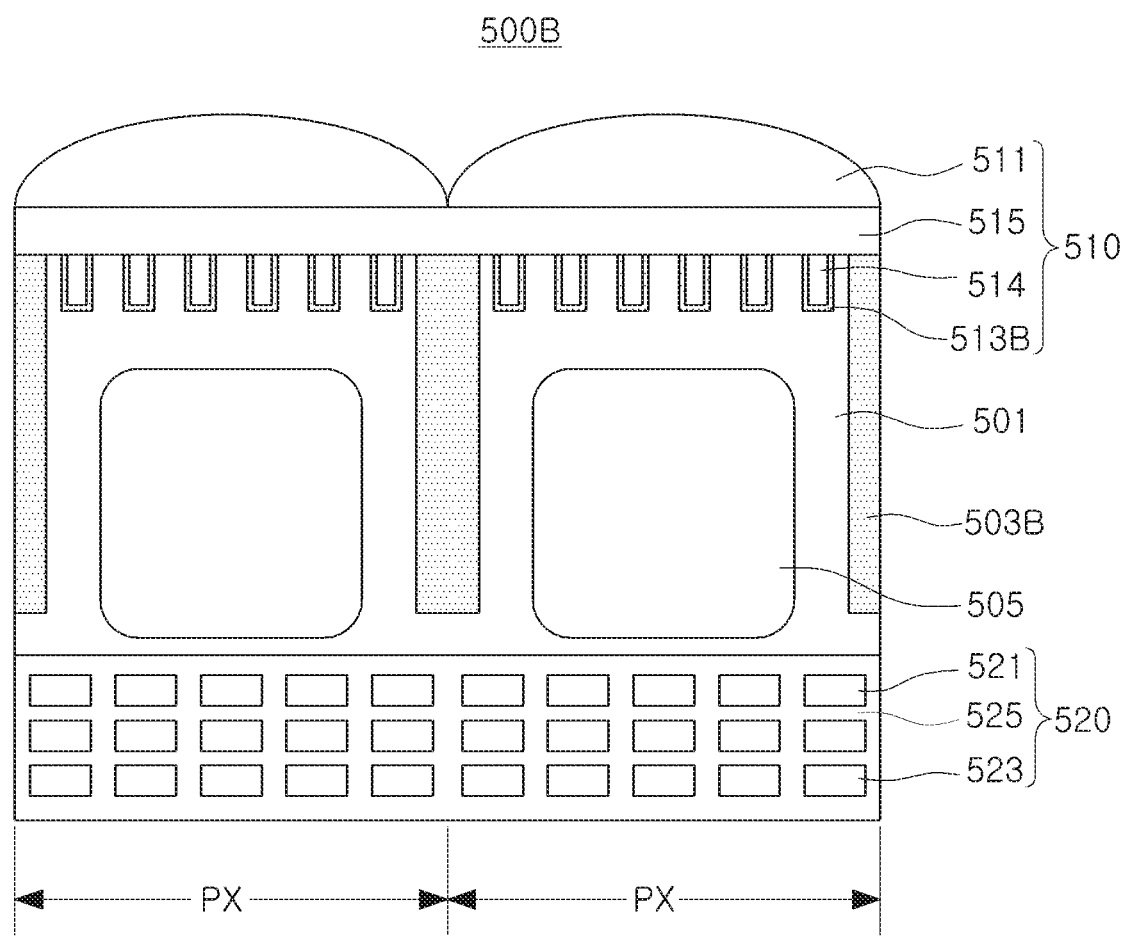

FIGS. 15 to 17 are cross-sectional views illustrating pixels of an image sensor including various types of conductive patterns and pixel isolation layers according to some example embodiments of the inventive concepts.

Referring to FIG. 15, an image sensor 500 may include a semiconductor substrate 501, a pixel circuit region 520 disposed on a first surface of the semiconductor substrate 501, an optical region 510 disposed on a second surface of the semiconductor substrate 501, and/or the like. The semiconductor substrate 501 may provide a plurality of pixel regions defined by a pixel isolation layer 503, and a photodiode 505 may be formed in each of the plurality of pixel regions. Configurations and/or operations of the semiconductor substrate 501, the pixel isolation layer 503, the photodiode 505, and/or the pixel circuit region 520 may be the same or similar to those described with reference to FIG. 6.

An optical region 510 may include a microlens 511, conductive patterns 513, an optical insulating layer 515, and/or the like. In the example illustrated in FIG. 15, the conductive patterns 513 may be embedded in the semiconductor substrate 501. Accordingly, a contact area between the semiconductor substrate 501 and the conductive patterns 513 may be increased, and charge generation efficiency may be improved by a Schottky barrier.

Referring to FIG. 16, an image sensor 500A may include a semiconductor substrate 501, a pixel circuit region 520 disposed on a first surface of the semiconductor substrate 501, an optical region 510 disposed on a second surface of the semiconductor substrate 501, and/or the like. Configurations and/or operations of the optical region 510 and the pixel circuit region 520 may be the same as or similar to those described with reference to FIG. 15.

In the example illustrated in FIG. 16, a pixel isolation layer 503A may extend from the second surface of the semiconductor substrate 501 and may be formed of a conductive material. In the example illustrated in FIG. 16, a pixel isolation layer 503A may be formed together during a process of forming the conductive patterns 513. As an example, when a plurality of first trenches for forming the conductive patterns 513 are formed to extend inwardly of the semiconductor substrate 501 from the second surface of the semiconductor substrate 501, second trenches for forming the pixel isolation layer 503A may be formed together. When the first trenches are filled with a conductive material to form the conductive patterns 513, the second trenches may also be filled with the conductive material to form the pixel isolation layer 503A.

Referring to FIG. 17, an image sensor 500B may include a semiconductor substrate 501, a pixel circuit region 520 disposed on a first surface of the semiconductor substrate 501, an optical region 510 disposed on a second surface of the semiconductor substrate 501, and/or the like. A configuration and/or an operation of the pixel circuit region 520 may be the same as or similar to those of the image sensors 500 and/or 500A described with reference to FIGS. 15 and 16.

In the example illustrated in FIG. 17, conductive patterns 513B may be formed along internal surfaces of a plurality of trenches prepared in the semiconductor substrate 501, and insulating patterns 514 may be formed in internal spaces of the conductive patterns 513B. Trenches for forming the pixel isolation layer 503B may be formed together with the trenches for forming the conductive patterns 513B. In addition, the trenches for forming the pixel isolation layer 503B may be filled with the same insulating material as or a similar insulating material to the insulating pattern 514. Accordingly, the pixel isolation layer 503B may extend from the second surface of the semiconductor substrate 501 and may be formed of an insulating material.

FIGS. 18A to 18D illustrate a third method of manufacturing an image sensor according to some example embodiments of the inventive concepts.

Figure 18A:
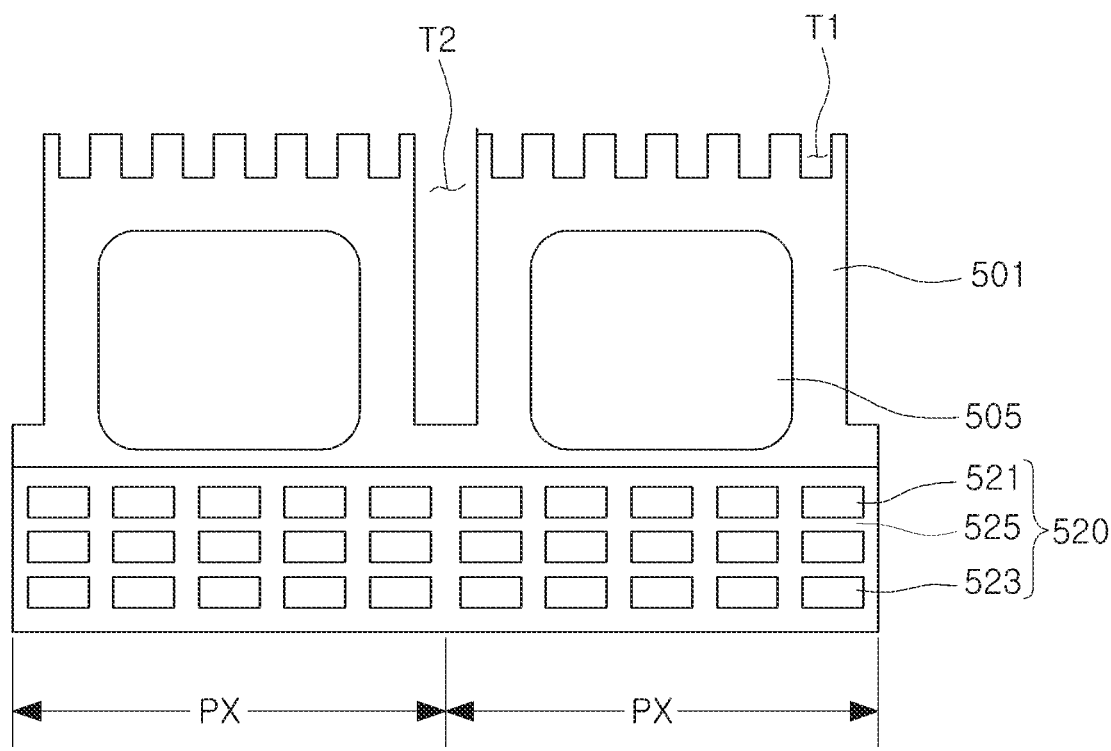
FIGS. 18A to 18D illustrate a third method of manufacturing an image sensor according to some example embodiments of the inventive concepts.

Referring to FIG. 18A, in a semiconductor substrate 501 having a plurality of pixel regions for forming a plurality of pixels PX, a photodiode 505 may be formed in each of the plurality of pixel regions. The semiconductor substrate 501 may have a first surface, and a second surface, opposing the first surface, and a pixel circuit region 520 may be prepared on the first surface. The pixel circuit region 520 may include a plurality of transistors 521 configured to convert a charge generated by the photodiode 505 into an electrical signal, interconnection lines 523 connecting at least some of the plurality of transistors 521 to each other, a circuit insulating layer 525, and/or the like.

When the pixel circuit region 520 is formed, the semiconductor substrate 501 may be turned over to expose the second surface and a polishing process may selectively be performed. As illustrated in FIG. 18A, a first trench T1 and a second trench T2 may be formed from the second surface of the semiconductor substrate 501. The second trench T2 may be formed between the plurality of pixel regions and may have a length greater than a length of the first trench T1.

Figure 18B:
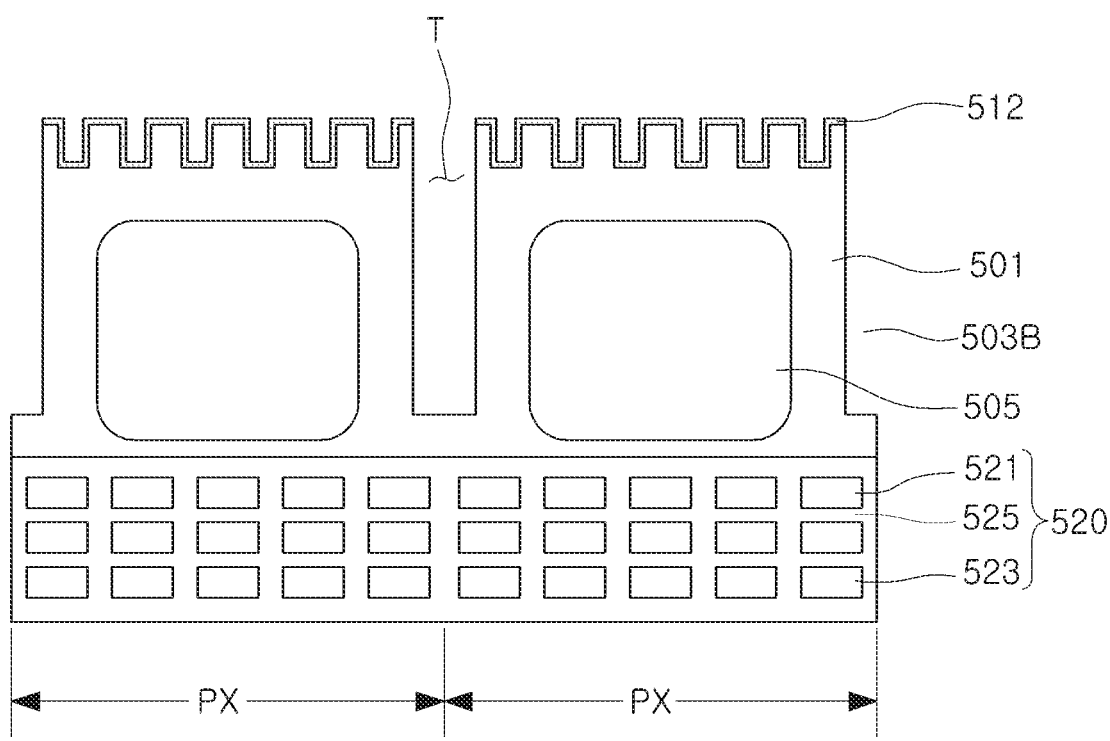

Referring to FIG. 18B, a conductive layer 512 may be formed in the first trench T1 formed in the semiconductor substrate 501. According to some embodiments, the conductive layer 512 may be conformally formed on an internal surface of the first trench T1 without completely filling the trench T1. Accordingly, a space may be formed in the conductive layer 512, as illustrated in FIG. 18B. As illustrated, the conductive layer 512 is not formed in the second trench T2. However, according to some embodiments, the conductive layer 512 may be formed in the second trench T2.

Figure 18C:
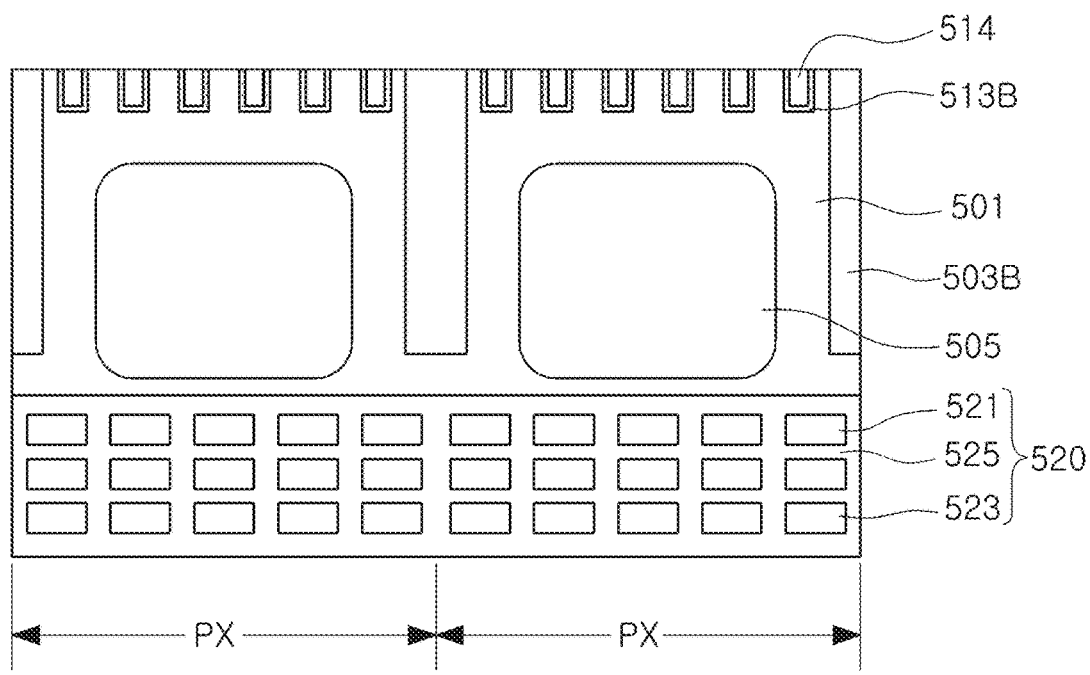
Figure 18D:
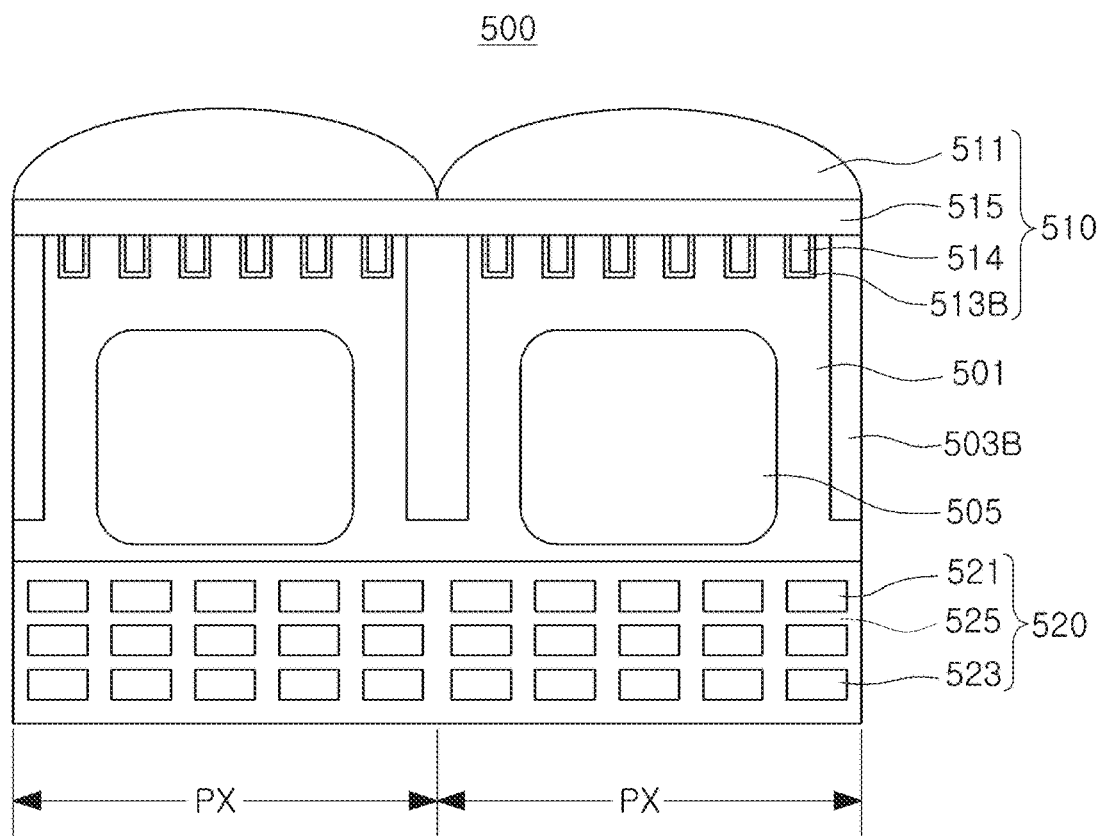

Referring to FIG. 18C, a portion of the conductive layer 512 may be removed on the second surface of the semiconductor substrate 501, and an insulating material may fill an internal space of the conductive layer 512 and the second trench T2. Thus, conductive patterns 513B, insulating patterns 514, and/or a pixel isolation layer 503B may be formed. According to some embodiments, a process of removing a portion of the conductive layer 512 on the second surface of the semiconductor substrate 501 may be omitted. Referring to FIG. 18D, an optical insulating layer 515 and a microlens 511 may be formed on the second surface of the semiconductor substrate 501. The optical insulating layer 515, the microlens 511, the conductive patterns 513B, and/or the insulating patterns 514 may provide an optical region 510.

Figure 19:
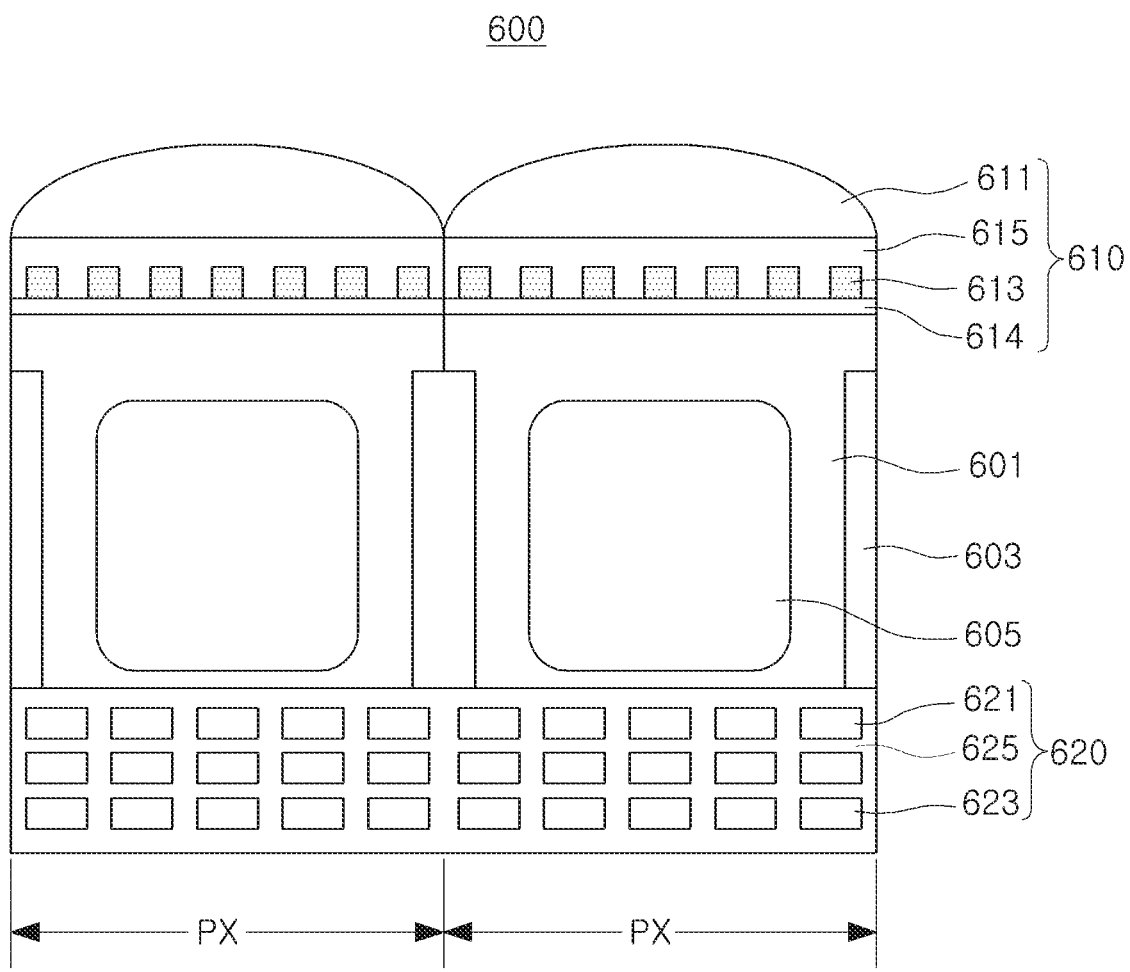
FIGS. 19 and 25 are plan views illustrating pixels of an image sensor including various types of optical regions according to some example embodiments of the inventive concepts.
Figure 25:
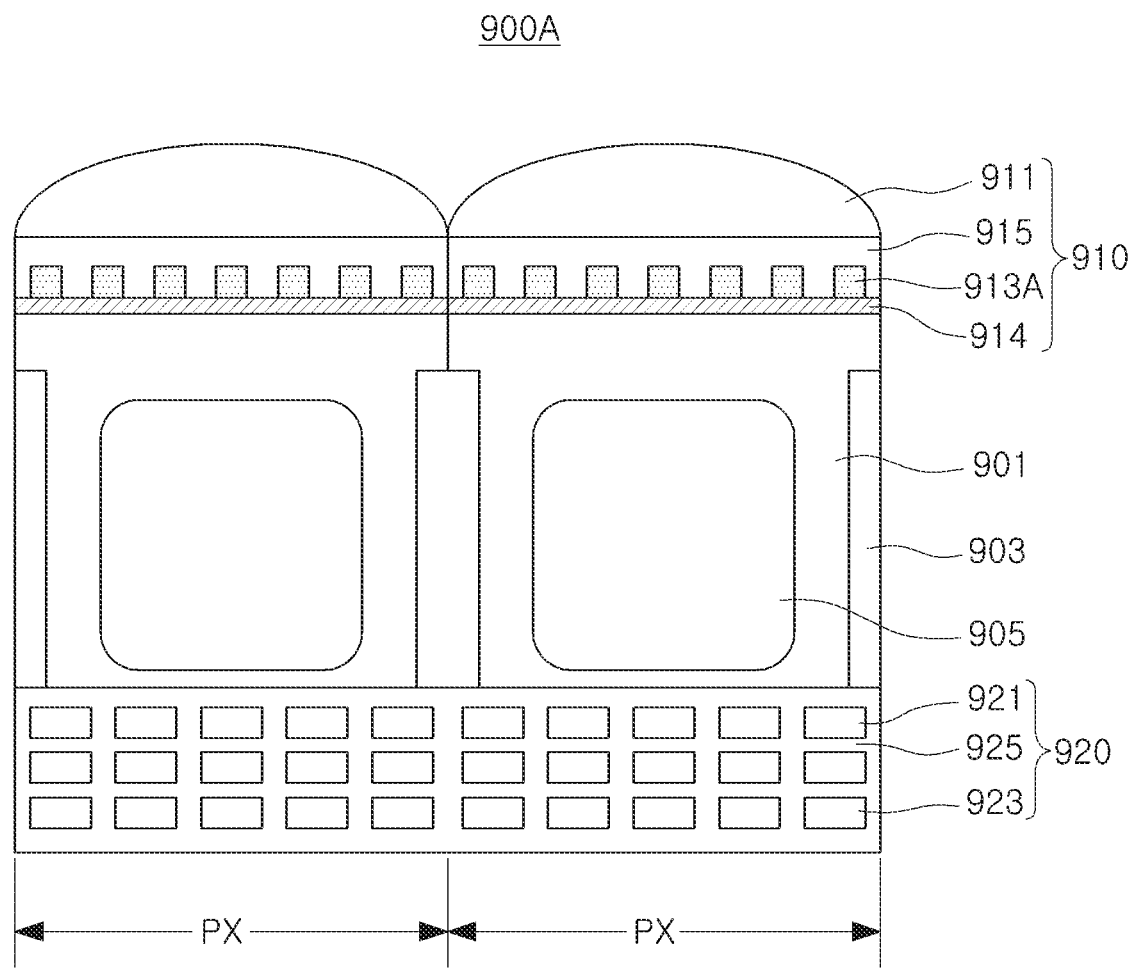

FIGS. 19 and 25 are plan views illustrating pixels of an image sensor including various types of optical regions according to some example embodiments of the inventive concepts.

Referring to FIG. 19, an image sensor 600 may include a semiconductor substrate 601 in which a photodiode 605 and a pixel isolation layer 603 are formed, a pixel circuit region 620 formed on a first surface of the semiconductor substrate 601, an optical region 610 formed on a second surface of the semiconductor substrate 601, and/or the like. A configuration and/or an operation of the pixel circuit region 620 may be the same as or similar to any of those described above.

The optical region 610 may include a microlens 611, conductive patterns 613, an intermediate insulating layer 614, an optical insulating layer 615, and/or the like. The microlens 611, the conductive patterns 613, and/or the optical insulating layer 615 may be the same as or similar to those in any of the above-described examples. As an example, the conductive patterns 613 may be formed of a metal material, a metal silicide material, a transparent conductive material, and/or the like.

The intermediate insulating layer 614 may be disposed between the semiconductor substrate 601 and the conductive patterns 613 and may be formed of a material, through which electrons may pass due to a tunneling effect, for example, a silicon oxide, and/or the like. According to some embodiments, the intermediate insulating layer 614 may be formed of a dielectric material containing fluorine and/or hydrogen.

The intermediate insulating layer 614 may have a thickness smaller than a thickness of each of the conductive patterns 613 and/or a thickness of the optical insulating layer 615. For example, the intermediate insulating layer 614 may have a thickness of 3 nm or less. In an example embodiment, the intermediate insulating layer 614 may have a thickness smaller than or equal to $\frac{1}{5}$ of a thickness of each of the conductive patterns 613.

Figure 20:
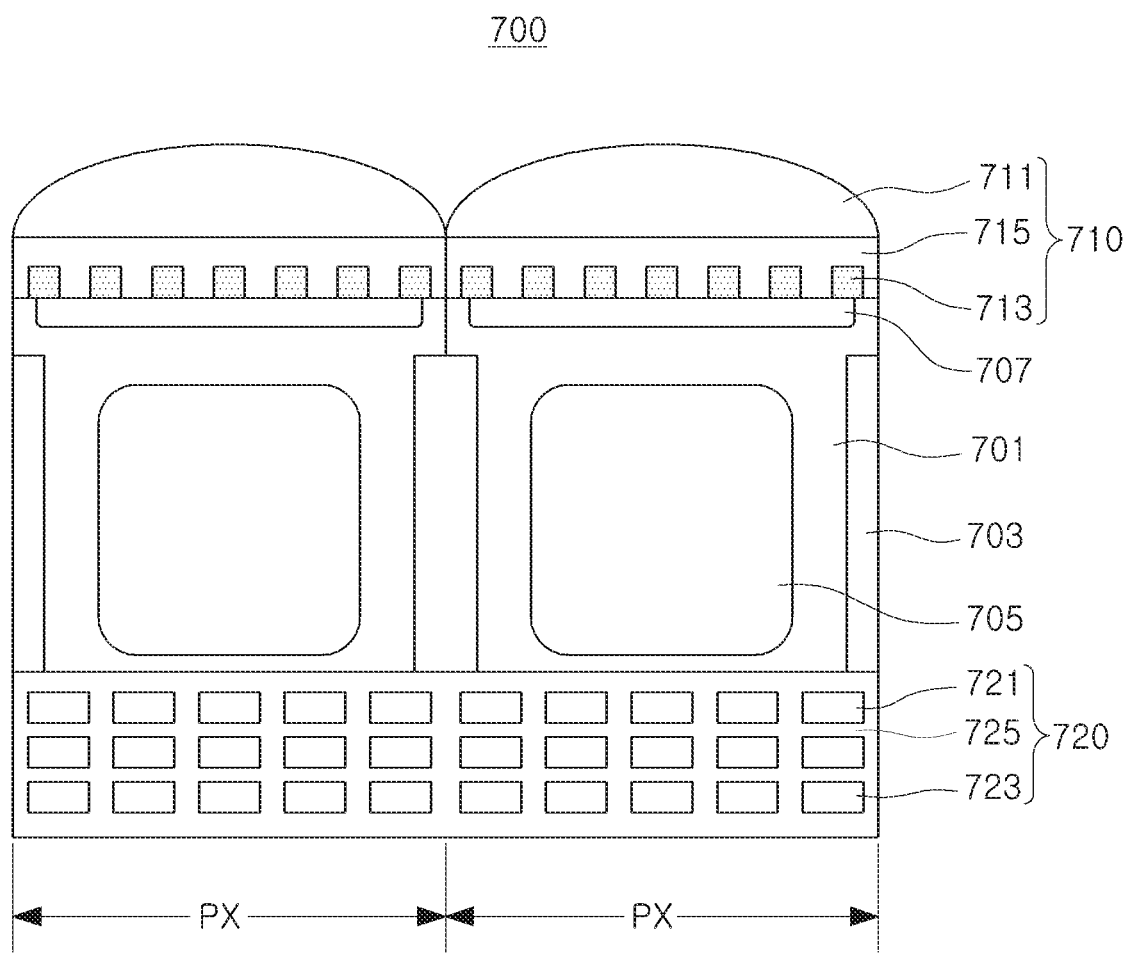

Referring to FIG. 20, an image sensor 700 may include a semiconductor substrate 701 in which a photodiode 705 and a pixel isolation layer 703 are formed, a pixel circuit region 720, and/or an optical region 710. In the image sensor 700 according to the example illustrated in FIG. 20, the semiconductor substrate 701 may further include an impurity region 707 in addition to the photodiode 705 and the pixel isolation layer 703.

The impurity region 707 may be doped with impurities of a first conductivity type, and may be formed adjacent to conductive patterns 713. As an example, when electrons are generated as main charge carriers, the impurity region 707 may be doped with P-type impurities, and the impurity region 707 may be formed to significantly reduce generation of dark current.

Figure 21:
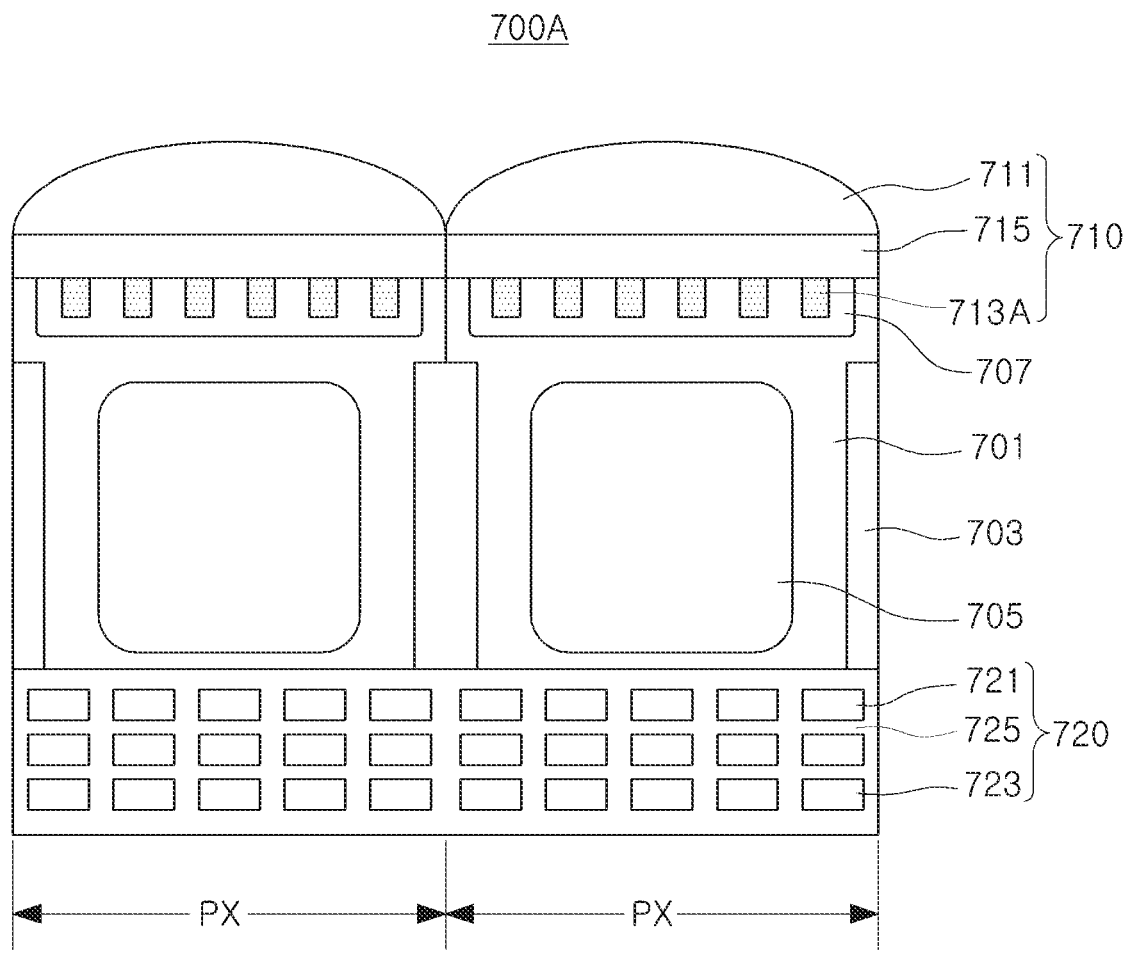

Unlike the image sensor 700 according to the example illustrated in FIG. 20, the image sensor 700A according to the example illustrated in FIG. 21 may include conductive patterns 713A embedded in the semiconductor substrate 701A. Thus, the impurity region 707, formed adjacent to the conductive patterns 713A, may be formed in the semiconductor substrate 701 to surround the conductive patterns 713A.

Figure 22:
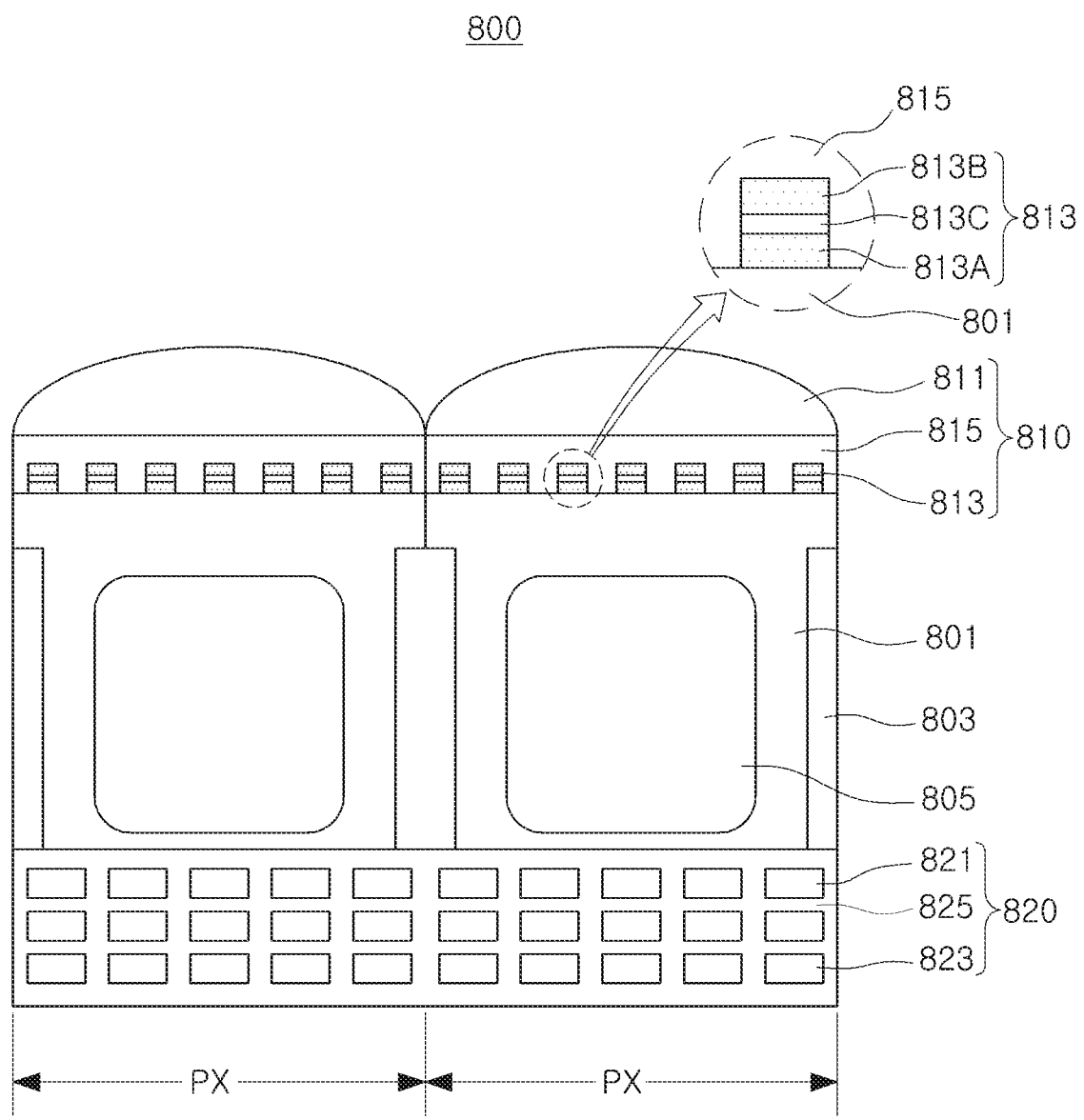

Referring to FIG. 22, an image sensor 800 may include a semiconductor substrate 801 in which a photodiode 805 and a pixel isolation layer 803 are formed, a pixel circuit region 820, an optical region 810, and/or the like. In the image sensor 800 according to the example illustrated in FIG. 22, the conductive patterns 813 may include a plurality of layers.

In an example embodiment, the conductive patterns 813 may include a first conductive layer 813A, a second conductive layer 813B, a pattern insulating layer 813C disposed therebetween, and/or the like. According to some embodiments, one or more pattern insulating layers 813C may be omitted or added, and a conductive layer may be further added in addition to the first conductive layer 813A and the second conductive layer 813B. The second conductive layer 813B may be formed of a material different from a material of the first conducive layer 813A, and may be formed closer to the microlens 811 than to the first conductive layer 813A. In an example embodiment, the first conductive layer 813A may be formed of a metal silicide material, and/or the second conductive layer 813B may be formed of a metal material.

Figure 23:
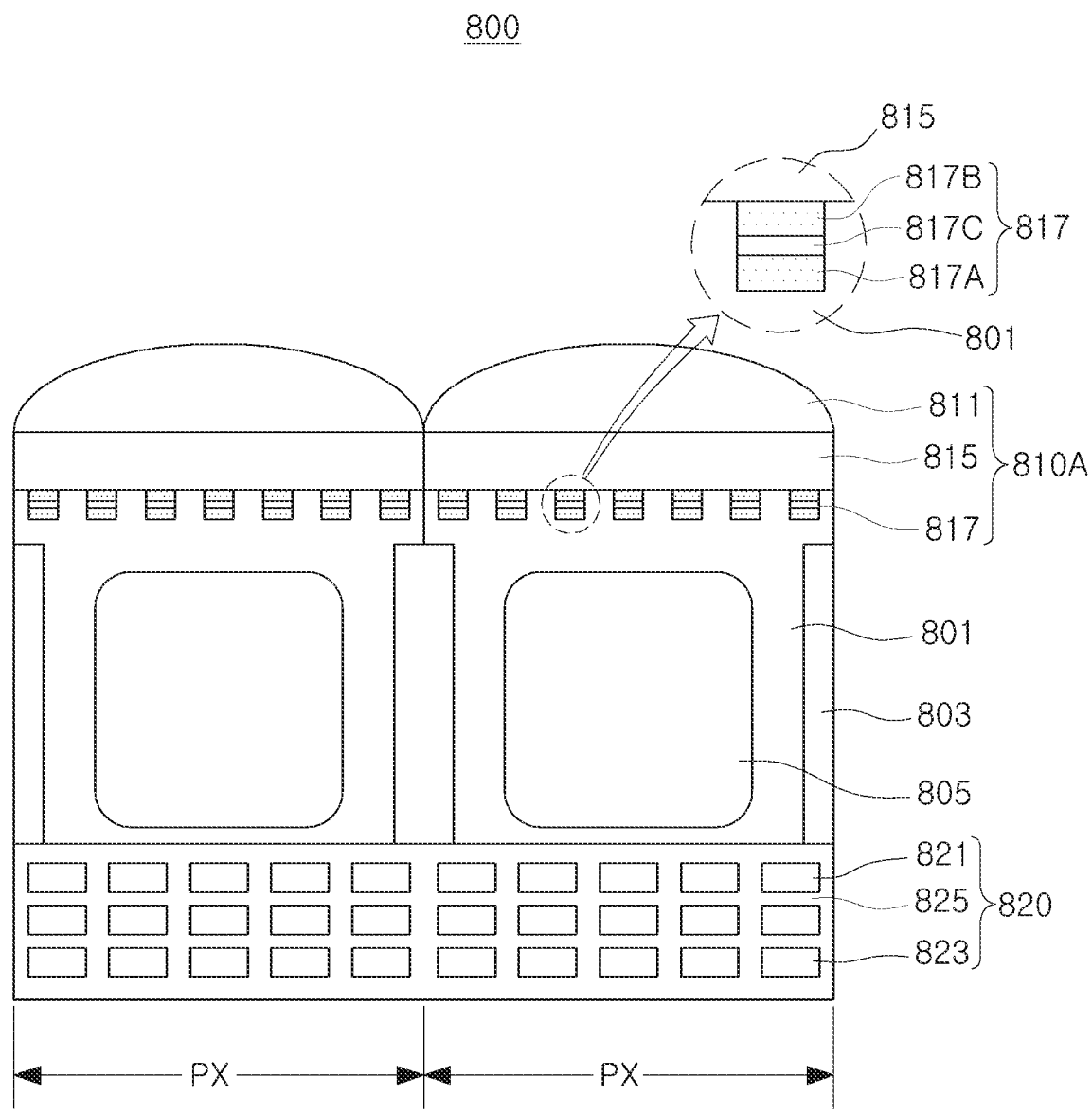

An image sensor 800A according to the example illustrated in FIG. 23 may include conductive patterns 817 embedded in a semiconductor substrate 801A. The conductive patterns 817, embedded in the semiconductor substrate 801A, may include a first conductive layer 817A, a second conductive layer 817B, a pattern insulating layer 817C, and/or the like. The number and disposition order of conductive layers and insulating layers, included in the conductive patterns 817, may be variously changed.

Figure 24:
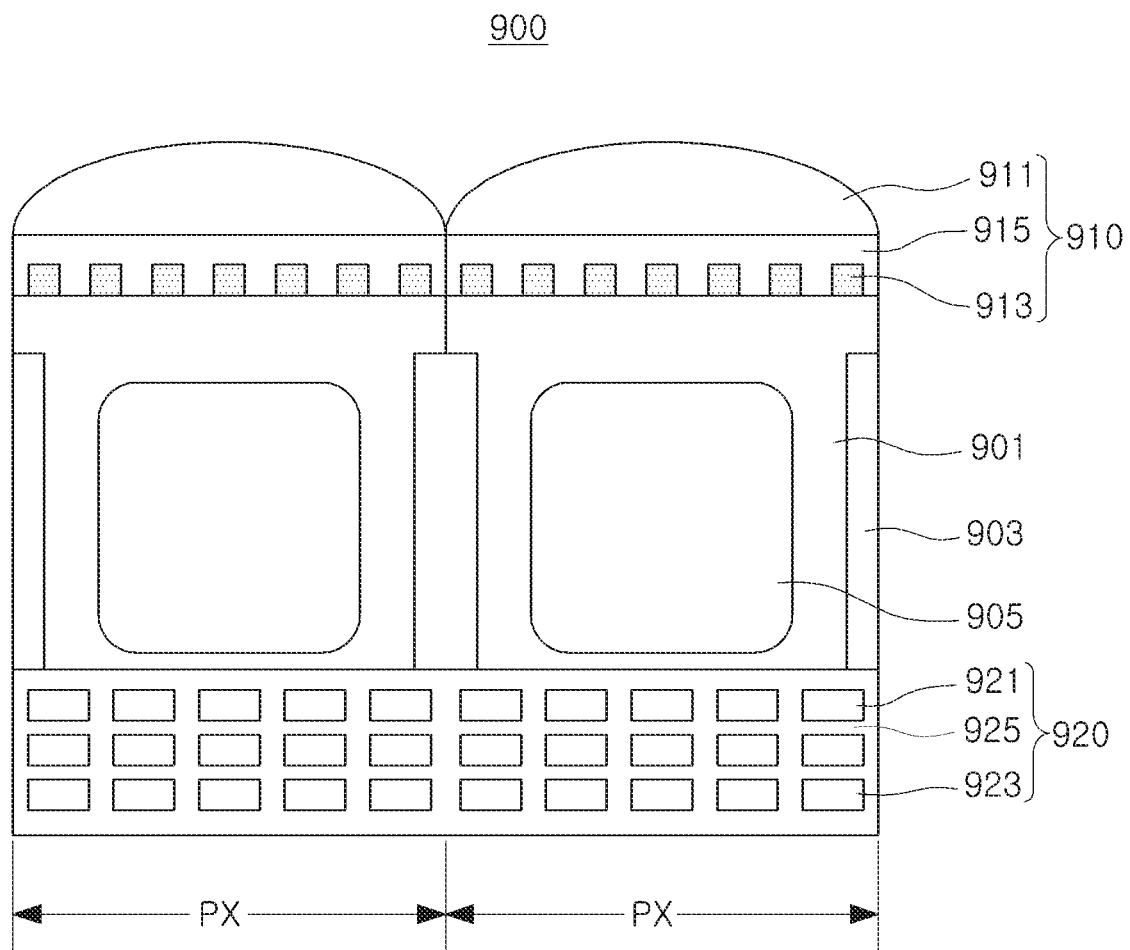

Referring to FIG. 24, an image sensor 900 may include a semiconductor substrate 901 in which a photodiode 905 and a pixel isolation layer 903 are formed, a pixel circuit region 920, an optical region 910, and/or the like. In the image sensor 900 according to the example illustrated in FIG. 24, conductive patterns 913 may include a plurality of layers. In the example illustrated in FIG. 24, the conductive patterns 913 may be formed of a conductive nanomaterial, for example, a graphene, a carbon nanotube, and/or the like.

Referring to FIG. 25, an image sensor 900A may include a semiconductor substrate 901, an optical region 910A, and/or a pixel circuit region 920, and the optical region 910A may include a microlens 911, conductive patterns 913A, an intermediate conductive layer 914, an optical insulating layer 915, and/or the like. The conductive patterns 913A may be formed of a metal material, a metal silicide material, a transparent conductive material, and/or the like, and/or the intermediate conductive layer 914 may be formed of a conductive nanomaterial such as a graphene, a carbon nanotube, and/or the like. The intermediate conductive layer 914 may not be patterned and may be formed on or substantially on the entire second surface of the semiconductor substrate 901 throughout a plurality of pixel regions.

Figure 26:
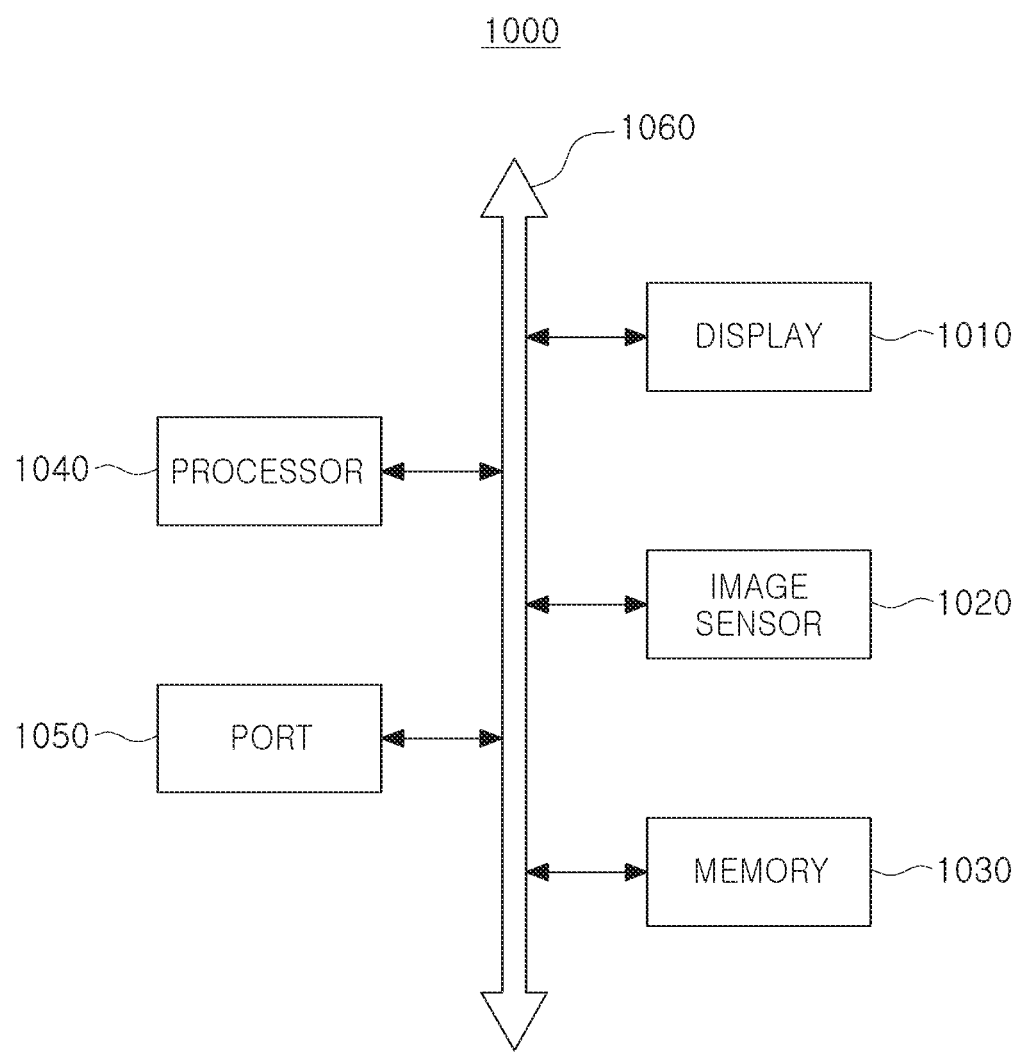
FIG. 26 is a block diagram of an electronic device including an image sensor according to some example embodiments of the inventive concepts.

FIG. 26 is a block diagram of an electronic device including an image sensor according to some example embodiments of the inventive concepts.

A computer device 1000 according to the example illustrated in FIG. 26 may include a display 1010, an image sensor 1020, a memory 1030, processing circuitry 1040, a port 1050, and/or the like. The computer device 1000 may further include a wired and/or wireless communications unit, a power supply, and/or the like. Among the components illustrated in FIG. 26, the port 1050 may be provided to allow the computer device 1000 to communicate with a video card, a sound card, a memory card, a universal serial bus (USB) device, and/or the like. The computer device 1000 may be a typical desktop computer and/or a laptop computer, as well as a smartphone, a tablet personal computer (PC), a smart wearable device, and/or the like.

The processing circuitry 1040 may perform specific operations, commands, tasks, and/or the like. For example, the processing circuitry 1040 may be a central processing unit (CPU), a microprocessor unit (MCU), or a system-on-chip (SoC) and may communicate with the display 1010, the image sensor 1020, the memory device 1030, as well as to other units connected the port 1050, through a bus 1060.

The memory 1030 may be a storage medium configured to store data and/or multimedia data used for operating the computer device 1000. The memory 1030 may include volatile memory, such as random access memory (RAM) and/or a nonvolatile memory such as flash memory. In addition, the memory 1030 may include at least one of a solid state drive (SSD), a hard disc drive (HDD), and/or an optical drive (ODD) as a storage unit. The image sensor 1020 may be employed in a computer device 1000 in the form of various embodiments described with reference to FIGS. 1 to 25.

As described above, an image sensor according to example embodiments may include a semiconductor substrate providing a plurality of pixel regions, and conductive patterns may be formed on one surface of the semiconductor substrate to be in direct contact with the semiconductor substrate. A wavelength band of an optical signal, in which charges may be generated in the semiconductor substrate, may be determined by the conductive patterns. Accordingly, an image sensor, configured to sense an optical signal of a wavelength band in which intensity of sunlight is low, and an imaging device using the image sensor, may be implemented. Moreover, stable operations of the image sensor and the imaging device may be secured irrespective of the intensity of sunlight.

Spatially relative terms, such as "on," "covering," and/or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "on" other elements or features would then be oriented "under" the other elements or features. Thus, the term "on" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected or coupled to the other element or intervening elements may be present. As used herein the term "and/or" includes any and all combinations of one or more of the associated listed items.

Some example embodiments are described herein with reference to cross-sectional illustrations that are schematic illustrations of idealized example embodiments (and intermediate structures) of some example embodiments. As such, variations from the shapes of the illustrations as a result, for example, of manufacturing techniques and/or tolerances, are to be expected. Thus, some example embodiments should not be construed as limited to the particular shapes of regions illustrated herein but are to include deviations in shapes that result, for example, from manufacturing.

The various and advantageous advantages and effects of the inventive concepts are not limited to the above description, and may be more easily understood in the course of describing a some example embodiments of the inventive concepts.

While some example embodiments have been shown and described above, it will be apparent to those skilled in the art that modifications and variations could be made without departing from the scope of the inventive concepts as defined by the appended claims.

What is claimed is:

1. An image sensor comprising:
a semiconductor substrate including a plurality of pixel regions, a first surface, and a second surface opposing the first surface;
a plurality of transistors adjacent to the first surface of the semiconductor substrate in each of the plurality of pixel regions;
a microlens on the second surface of the semiconductor substrate; and
a plurality of conductive patterns directly in contact with the second surface of the semiconductor substrate to form a Schottky barrier between the plurality of conductive patterns and the second surface of the semiconductor substrate, the plurality of conductive patterns being closer to the second surface of the semiconductor substrate than to the first surface of the semiconductor substrate in each of the plurality of pixel regions, and the plurality of conductive patterns being configured to conduct electrons generated by an optical signal to the semiconductor substrate over the Schottky barrier.

2. The image sensor of claim 1, wherein the plurality of conductive patterns have at least one of a line shape or a lattice shape.

3. The image sensor of claim 1, wherein
the plurality of pixel regions includes a first pixel region and a second pixel region adjacent to each other; and
the plurality of conductive patterns includes a first conductive pattern and a second conductive pattern, the first conductive pattern contacts the second surface of the semiconductor substrate in the first pixel region, the second conductive pattern contacts the second surface of the semiconductor substrate in the second pixel region, and the first conductive pattern has a first shape different from a second shape of the second conductive pattern.

4. The image sensor of claim 3, wherein the first conductive pattern includes a first plurality of lines extending in a first direction, and the second conductive pattern includes a second plurality of lines extending in a second direction different from the first direction.

5. The image sensor of claim 1, wherein the plurality of conductive patterns are electrically connected to each other throughout the plurality of pixel regions.

6. The image sensor of claim 1, wherein a bottom surface of the plurality of conductive patterns is directly on the second surface of the semiconductor substrate.

7. The image sensor of claim 1, wherein the plurality of conductive patterns are in the semiconductor substrate, and each of the plurality of conductive patterns has a top surface coplanar with the second surface of the semiconductor substrate.

8. The image sensor of claim 7, further comprising:
a pixel isolation layer forming a boundary between the plurality of pixel regions, at least some of the plurality of conductive patterns being on the pixel isolation layer.

9. The image sensor of claim 7, wherein the plurality of conductive patterns are along an internal surface of a trench formed by the semiconductor substrate, the trench extends from the second surface of the semiconductor substrate, and an insulating pattern is in a plurality of internal spaces formed by the plurality of conductive patterns.

10. The image sensor of claim 1, wherein the semiconductor substrate includes an impurity region adjacent to the plurality of conductive patterns and doped with impurities of a first conductivity type.

11. The image sensor of claim 1, wherein the conductive patterns may include at least one of a metal material, a metal silicide material, or a transparent conductive material.

12. The image sensor of claim 1, further comprising:
an optical insulating layer between the microlens and the semiconductor substrate, the optical insulating layer covering the plurality of conductive patterns.

13. The image sensor of claim 1, wherein each of the plurality of conductive patterns includes a first conductive layer and a second conductive layer, the first conductive layer includes a first conductive material different from a second conductive material of the second conductive layer, and the second conductive layer is closer to the microlens than to the first conductive layer.

14. The image sensor of claim 13, wherein each of the plurality of conductive patterns includes a pattern insulating layer between the first conductive layer and the second conductive layer.

* * * * *